US008377570B2

(12) United States Patent
Chen et al.

(10) Patent No.: US 8,377,570 B2

(45) Date of Patent: Feb. 19, 2013

(54) POLY(ARYLENEVINYLENE) AND POLY(HETEROARYLENEVINYLENE) LIGHT EMITTING POLYMER AND POLYMER LIGHT-EMITTING DEVICES

(75) Inventors: Zhikuan Chen, Singapore (SG); Chun Huang, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 938 days.

(21) Appl. No.: 11/666,833

(22) PCT Filed: Nov. 1, 2004

(86) PCT No.: PCT/SG2004/000359

§ 371 (c)(1), (2), (4) Date: Apr. 14, 2008

(87) PCT Pub. No.: WO2006/049579

PCT Pub. Date: May 11, 2006

(65) Prior Publication Data

US 2008/0272691 A1 Nov. 6, 2008

(51) Int. Cl.
*H01L 51/54* (2006.01)
*C09K 11/06* (2006.01)

(52) U.S. Cl. ........... 428/690; 428/917; 313/504; 257/40

(58) Field of Classification Search ........................ None
See application file for complete search history.

(56) References Cited

U.S. PATENT DOCUMENTS

| | | | | |
|---|---|---|---|---|
| 5,189,136 | A | 2/1993 | Wudl et al. | |
| 5,512,654 | A | 4/1996 | Holmes et al. | |
| 5,514,878 | A | 5/1996 | Holmes et al. | |
| 5,558,904 | A | 9/1996 | Hsieh et al. | |
| 5,670,212 | A | 9/1997 | Staring et al. | |
| 5,679,757 | A | 10/1997 | Wudl et al. | |
| 5,747,182 | A | 5/1998 | Friend et al. | |
| 5,807,974 | A * | 9/1998 | Kim et al. | 528/366 |
| 5,817,430 | A | 10/1998 | Hsieh | |
| 5,909,038 | A | 6/1999 | Hwang et al. | |
| 5,998,803 | A * | 12/1999 | Forrest et al. | 257/40 |
| 6,368,732 | B1 | 4/2002 | Jin et al. | |
| 6,403,237 | B1 | 6/2002 | Noguchi et al. | |
| 6,414,104 | B1 | 7/2002 | Pei | |
| 6,445,126 | B1 | 9/2002 | Arai et al. | |
| 6,458,909 | B1 | 10/2002 | Spreitzer et al. | |
| 6,693,158 | B2 | 2/2004 | Chen et al. | |
| 6,791,129 | B2 | 9/2004 | Inukai | |
| 6,936,683 | B1 | 8/2005 | Vanderzande et al. | |
| 7,041,388 | B1 | 5/2006 | Spreitzer et al. | |
| 2002/0001732 | A1 * | 1/2002 | Schoo et al. | 428/690 |
| 2002/0061419 | A1 | 5/2002 | Woo et al. | |
| 2002/0061420 | A1 | 5/2002 | Sohn et al. | |
| 2002/0064680 | A1 | 5/2002 | Spreitzer et al. | |
| 2002/0093005 | A1 | 7/2002 | Wagner et al. | |
| 2002/0135296 | A1 * | 9/2002 | Aziz et al. | 313/504 |
| 2003/0088043 | A1 * | 5/2003 | Huang et al. | 528/25 |
| 2004/0018382 | A1 | 1/2004 | Kinlen | |

FOREIGN PATENT DOCUMENTS

| | | | |
|---|---|---|---|
| CN | 1275304 | A | 11/2000 |
| DE | 199 53 806 | A1 | 5/2001 |
| EP | 0 714 556 | B1 | 1/1999 |
| JP | 2002-003834 | | 1/2002 |
| JP | 2002 319493 | A | 10/2002 |
| WO | WO-93/14177 | A1 | 7/1993 |
| WO | WO-98/27136 | A1 | 6/1998 |
| WO | WO-99/21936 | A1 | 5/1999 |
| WO | WO-00/35987 | A1 | 6/2000 |
| WO | WO-01/62716 | A3 | 8/2001 |
| WO | WO-01/62716 | A3 | 4/2002 |
| WO | WO-02/28984 | | 4/2002 |

OTHER PUBLICATIONS

European Office Action dated Jan. 20, 2011 issued in corresponding EP Application No. 04775675.4.

Zhonghua Peng. New Phenyl-Substituted PPV Derivatives for Polymer Light-emitting Diodes-Synthesis, . . . Macromolecules 2003, 36, 1009-1020.

Zhi-Kuan Chen et al. New Poly(p-phenylene vinylene) Derivatives Exhibiting High Photoluminescence Quantum Efficiencies. Macromolecules 1999, 32, 5162-5164.

Supplementary European Search Report dated Dec. 1, 2008, European Patent Application No. 04775675.4.

European Office Action for EP 04 775 675.4-2102 dated Dec. 7, 2009.

Ko, S.W., et al., "Synthesis and Characterization of New Orange-Red Light-Emitting PPV Derivatives with Bulky Cyclohexyl Groups", Bull. Korean Chem. Soc., 2002, 23(9): 1235-1240.

Ding, A.-L., et al., "Phenylene-functionalized polythiophene derivatives for light-emitting diodes: their synthesis, characterization and properties", J. Mater. Chem., 2001, 11: 3082-3086.

Liu, J., et al., "End Group Modification of Regioregular Polythiophene through Postpolymerization Functionalization", Macromolecules, 2002, 35: 9882-9889.

Kim, J., "Assemblies of conjugated polymers. Intermolecular and intramolecular effects on the photophysical properties of conjugated polymers", Pure Appl. Chem., 2002, 74: 2021-2081.

Hsieh, B.R., et al., "Chlorine Precursor Route (CPR) Chemistry to Poly(p-phenylene vinylene)-Based Light Emitting Diodes", Advanced Materials, 1995, 7(1): 36-38.

Roncali, J. "Synthetic Principles for Bandgap Control in Linear pi-Conjuaged Systems", Chem. Rev., 1997, 97: 173-205.

(Continued)

*Primary Examiner* — Jennifer Chriss
*Assistant Examiner* — Andrew K Bohaty
(74) *Attorney, Agent, or Firm* — Klarquist Sparkman, LLP

(57) ABSTRACT

The invention provides novel luminescent poly(arylenevinylene) and poly(heteroarylenevinylene) polymers. The polymers of the invention may be prepared as films and such films may be used as an emissive layer in polymeric light emitting devices. In one embodiment, a bulky aryl group is attached at position (2) of at least one phenylene ring of a poly(phenylenevinylene) backbone. In another embodiment, the bulky aryl is attached at position 3 of at least one 5-membered heteroarylene ring of a poly(heteroarylenevinylene) backbone.

36 Claims, 9 Drawing Sheets

OTHER PUBLICATIONS

Zhu, Ying, "Notification of the First Office Action", State Intellectual Property Office of the People's Republic of China, Issued May 8, 2009, in CN 200480044456.2 (With English Translation).
Chen, Zhi-Kuan et al., "New Phenyl-Substituted PPV Derivatives for Polymer Light-Emitting Diodes-Synthesis, Characterization and Structure-Property Relationship Study", Macromolecules, 2003, pp. 1009-1020, vol. 36.
Peng, Zhonghua, "New Poly(P-Phenylene Vinylene) Derivatives Exhibiting High Photoluminescence Quantum Efficiencies", Macromolecules, 1999, pp. 5162-5164, vol. 32.
3rd Office Action issued in Chinese Patent Application No. 200480044456.2 (date of issue—Nov. 23, 2011).
2nd Examination Report dated Feb. 17, 2012 (issued in EP Application No. 04775675.4).
2nd Office Action dated Dec. 20, 2011 (issued in JP Application No. 538868-2007).
4th Office Action (dated Jun. 12, 2012) issued in corresponding Chinese Patent Application No. 200480044456.2.
Japanese Office Action dated Nov. 16, 2010 issued in Japanese Application No. 5388682007.
English Translation of Japanese Office Action dated Nov. 16, 2010 (issued in Japanese Application No. 5388682007).
English Translation of JP 2002-003834 Date of publication: Jan. 9, 2002.
Chen, Z. et al., "New Phenyl-Substituted PPV Derivatives for Polymer Light-emitting Diodes—Synthesis, Characterization and Structure—Property Relationship Study", Macromolecules, 2003, pp. 1009-1020, vol. 36.
Peng, Z. et al., "New Poly(p-phemylene vinylene) Derivatives Exhibiting High Photoluminescence Quantum Efficiencies", Macromolecules, 1999, pp. 5162-5164, vol. 32.
Burroughes, et al. "Light-emitting diodes based on conjugated polymers". Nature, 1990, 347: 539.
Fukuda, et al. "Synthesis of Fusible and Soluble Conducting Polyfluorene Derivatives and Their Characteristics". J. Polym. Sci. Polym. Chem., 1993, 31: 2465.
Berggren, et al. "Light-emitting diodes with variable colours from polymer blends". Nature, 1994, 372: 444.
Lowe, et al. "Synthesis and properties of a sterically encumbered poly(thienylene vinylene): poly[E-1,2-(4,4'-dihexy1-2,2'-dithienypethylene]". Can. J. Chem., 1998, 76: 1524-1529.
Chung, S.J., et al. "Improved-Efficiency Light-Emitting Diodes Prepared from Organic-Soluble PPV Derivatives with Phenylanthracene and Branched Alkoxy Pendents". Adv. Mater., 1998, 10: 684.
Chen, Z.K., et al. "New Phenyl-Substituted PPV Derivatives for Polymer Light-emitting Diodes—Synthesis, Characterization and Structure—Property Relationship Study". Macromolecules, 2003, 36(4): 1009.
Gilch, H., et al. "Polymerization of alpha-Halogenated p-Xylenes With Base". Journal of Polymer Sci., 1966, A-I(4): 1337-1349.
Drefalh, et al. "Oligomere als Modelle fur Poly-p-xylyliden". Makromol. Chem., 1970, 131:89.
Becker, et al. "Soluble PPVs with Enhanced Performance—A Mechanistic Approach". Advanced Materials, 2000, 12: 42.
Swatos, et al. "Polymerization of 2,5-Di-n-hexyloxy-alpha,alpha'-dichloro-p-xylene with Potassium tert-Butoxide: a Novel Route to Poy(2,5-di-n-hexyloxy-p-phenylee vinylene)". Polym. Prep., 1990, 31(1), 505.
Lee, et al. "Silyl-Substituted Poly(thienylenevinylene) via Heteroaromatic Dehydrohalogenation Polymerization". Macromol Rapid Commun., 2003, 24: 522-26.
Pu, Yong-Jin, et al. "A Novel Triphenylamine-Substituted Poly(p-phenylenevinylene): Improved Photo- and Electroluminescent Properties", Chem. Mater., 2001, 13(11): 3817-19.
Derwent Abstract Accession No. 2003-008477/01, "An organic electroluminescent device useful for a sheet light source as back light, a flat panel display and allows low-voltage driving and has enhanced brightness", Year of publication: 2003.
Spreitzer, et al. "Soluble Phenyl-Substituted PPVs—New Materials for Highly Efficient Polymer LEDs". Adv. Mater., 1998, 10: 1340.
Becker, H., et al. "New Insights into the Microstructure of GILCH-Polymerized PPVs". Macromolecules, 1999, 32: 4925.
Gustafsson, G., et al. "Flexible light-emitting diodes made from soluble conducting polymers". Nature, 1992, 357: 477.
Burn, P.L., et al. "Chemical tuning of electroluminescent copolymers to improve emission efficiencies and allow patterning". Nature, 1992, 356: 47.
Braun, D., et al. "Visible light emission from smiconducting polymer diodes". Appl. Phys. Lett., 1991, 58: 1982.
Garay, R.O., et al. "Synthesis and Characterization of Poly[2,5-bis(triethoxy)-1,4-phenylene vinylene]". J. Polym. Sci., 1995, A-I(33): 525.
Hoger, S., et al. "Novel Silicon-Substituted, Soluble Poly(phenylenevinylene)s: Enlargement of the Semiconductor Bandgap". Chem. Mater., 1994, 6: 171.
Zhang, C., et al. "Improved Efficiency in Green Polymer Light-Emitting Diodes with Air-Stable Electrodes". J. electron. Mater., 1994, 23: 453.
Andersson, M.R., et al. "Electroluminescence from Substituted Poly (thiophenes): From Blue to Near-Infrared". Macromolecules, 1995, 28: 7525.
Johansson, D.M., et al. "Influence of Polymerization Termperature on Molecular Weight, Photoluminescence, and Electroluminescence for a Phenyl-Substituted Poly(p-phenylenevinylene)". Macromolecules, 2001, 34: 3716.
Chen, Z.K., et al. "A Family of Electroluminescent Silyl-Substituted Poly(p-phenylenevinylene)s: Synthesis, Characterization, and Structure—Property Relationships". Macromolecules, 2000, 33: 9015.
Sohn, B.H., et al. "Synthesis and Luminescence Properties of Poly[2-(9,9-dihexylfluorene-2-yl)-1,4-phenylenevinylene] and Its Copolymers Containing 2-(2-Ethylhexyloxy)-5-methoxy-1,4-phenylenevinylene Units". Macromolecules, 2002, 35: 2876.
Lee, S.H., et al. "Sterically Hindered Fluorenyl-Substituted Poly(p-phenylenevinylenes) for Light-Emitting Diodes". Macromolecules, 2002, 35: 1356.
Jin, S.H., et al. "Synthesis and Characterization of Highly Luminescent Asymmetric Poly(p-phenylene vinylene) Derivatives for Light-Emitting Diodes" Chem. Mater., 2002, 14: 643.
Sarker, A.M., et al. "Synthesis and Luminescent Studies fo Poly(phenylenevinylene)s Containing a Biphenyl Moiety". Macromolecules, 2002, 35: 223.

* cited by examiner a)

b)

POLY(ARYLENEVINYLENE) AND POLY(HETEROARYLENEVINYLENE) LIGHT EMITTING POLYMER AND POLYMER LIGHT-EMITTING DEVICES

FIELD OF THE INVENTION

This invention relates to the field of luminescent conjugated polymers and to light-emitting devices (LEDs).

BACKGROUND OF THE INVENTION

Electroluminescent polymers have been extensively studied in the past few years owing to their promising applications in polymeric light-emitting devices (PLEDs), photovoltaic diodes, field emission transistors (FETs) and lasers. In the last decade, various types of conjugated polymers for use in light-emitting devices have been described. Fully conjugated polymers and their derivatives such as poly(p-phenylenevinylene) (PPV) (Burroughes, et al., Nature, 1990, 347, 539), poly(p-phenylene) (PPP) (Grem, et al., Adv. Mater., 1992, 4, 36), poly(fluorene)s (PF) (Fukuka et al., J. Polym. Sci. Polym. Chem., 1993, 31, 2456), and poly(3-alkylthiophene)s (Berggren, et al., Nature, 1994, 372, 444), poly(thienylvinylene) (Lowe et al., *Can J. Chem* (1998) 76: 1524-1529) amongst others, have been used.

Poly(p-phenylenevinylene) (PPV) and its derivatives have been widely used as emissive materials for light-emitting devices. Significant progress in improved efficiency, decreasing driving voltage and prolonging the lifetime of the devices have been made using PPVs as the emissive layers for LEDs in the past decade. In particular, applications in PLEDs have attracted significant attention following the first report of the PLED device based on poly(p-phenylenevinylene) (PPV) in 1990, mainly because of their fascinating perspectives of low cost processing through simple spin-coating or casting techniques, colour emission in the full range of visible spectrum, low driving voltage and large area display, and flexible structures.

The performance (e.g. efficiency and lifetime) of PLED devices depends on a large variety of factors, such as the device architecture, encapsulation method, preparation method, driving scheme, and the polymer itself. From the materials point of view, high performance devices require electroluminescent polymers with tailored properties such as high photoluminescence (PL) quantum efficiency, good processability, and high thermal/optical/electrical stability. So far, numerous conjugated polymers have been successfully synthesized and used as the active layers and/or transporting layers in PLEDs such as, PPV and its derivatives, PPP, polythiophenes (PTs), PF, poly(thienylenevinylene) (PTV) as well as their copolymers. Among them, PPV and their alkoxy derivatives are the most commonly used materials for PLEDs on account of their good device performance. In general, there are two approaches adopted for the preparation of processable PPVs—(i) the precursor approach and (ii) the side chain approach.

Currently, several precursor routes, namely the sulfonium, halogen and xanthate precursor routes, are used for the fabrication of PPV LEDs (WO93/14177). The precursor polymers, which are soluble in water or organic solvents, are converted to the fully conjugated form through a heat treatment process often at temperatures exceeding 200° C. Although the precursor polymer route may have some advantages, the multi-step synthesis is complex and the resultant polymers may contain structural defects. In addition, as a result of the heat treatment, the precursor route may not be applied to produce flexible plastic displays. These disadvantages limit its application.

The side chain approach involves the polymerization of suitably substituted monomers to form a soluble PPV derivative that can be directly cast into thin films. U.S. Pat. No. 5,189,136 discloses a partially soluble PPV polymer of poly(2 methoxy-5-(2'-ethylhexyloxy)-para-phenylenevinylene) (MEH-PPV) which may be processed into shaped articles, films, fibers, and the like. However, MEH-PPV is only partially soluble and MEH-PPV solutions are unstable and form gels at room temperature. Casting of uniform films of MEH-PPV is quite difficult and requires high experimental skill such that it is not economical.

Other soluble alkoxy substituted PPVs include poly(2,5-bis(2'-ethylhexyloxy)-p-phenylenevinylene) (BEH-PPV) and poly(2,5-bischolestanoxy-p-phenylenevinylene) (BCHA-PPV), which have demonstrated orange and yellow light emission with medium efficiencies in LED devices (U.S. Pat. No. 5,679,757).

Besides alkoxy substituted PPVs, another type of PPV polymer is aryl-substituted PPVs. Aryl groups can be attached at the phenylene rings and/or at the vinylene bridges of PPV. Both approaches may enhance the solubility of the resulting polymers. In addition to improved processability, aryl substitution may also enable enhanced photoluminescence efficiency and photo-stability. PPV normally emits green-yellow light and pure green light emission may be realized from aryl-substituted PPVs, due to the enlarged band gap associated with the steric effects of aryl side chain on the PPV backbone. Examples of aryl-substituted PPVs are poly (2,3-diphenyl-p-phenylene) (B. R. Hsieh, et al. (1995) *Adv. Mater.* 7: 36), poly(2-(2'-ethyl)hexyloxy-5-(10'-phenyl)anthryl-9'-yl-p-phenylene vinylene) (S. J. Chung, et al. (1998), *Adv. Mater.* 10: 684), and a series of phenyl-substituted PPV-based copolymers disclosed by Covion Organic Semiconductors (H. Spreitzer, et al, WO98/27136). These polymers have demonstrated good to excellent performance relating to quantum, power and luminance efficiencies. However, PPV derivatives prepared via the Gilch polymerization route may contain tolane-bisbenzyl (TBB) structural defects in the polymer backbone, which are thought to result from head-to-head or tail-to-tail polymerization instead of regular head-to-tail polymerization. The TBB structural defects in phenyl-substituted PPVs are even more severe than the standard dialkoxy PPVs such as MEH-PPV and $OC_1C_{10}$-PPV (5-6% vs. 1.5-2.2%). It was also shown that the operational lifetime was dramatically affected by the amount of TBB.

WO98/27136 discloses a new aryl substituted PPV based light emitting polymer called Super Yellow in which a strong electron donating methoxy group is attached to the PPV backbone to guide the polymer chain propagation during polymerization, which can partially suppress the formation of TBB structural defects. Super Yellow has demonstrated quite promising performance in terms of device efficiency and lifetime. However, this polymer is a yellow emitter, which is not very desirable for full color display applications.

When a biphenyl group is attached to PPV polymer backbone through position-2 of the side group, the resulting polymer can show as little as 0.36% TBB structural defects and the polymer emits green light (Chen Z K et al, Macromolecules, 2003, 36(4), 1009). This polymer, however, showed a tendency to form gels during storage and the quantum efficiency of the polymer is not satisfactory. Therefore, there is a need to develop stable and efficient light emitting polymers which can be easily solution processed.

SUMMARY OF THE INVENTION

In one aspect, the invention provides conjugated polymers of formula I

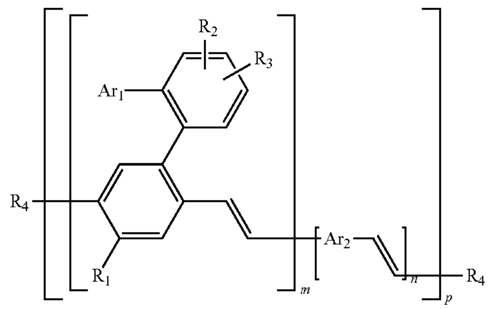

wherein $R_1$, $R_2$ and $R_3$ are independently selected from H, halogen, cyano, substituted or unsubstituted alkyl, substituted or unsubstituted alkoxy, substituted or unsubstituted alkylthio, substituted or unsubstituted alkylamino, substituted or unsubstituted alkenyl, substituted or unsubstituted alkynyl, substituted or unsubstituted aryl, substituted or unsubstituted heteroaryl, substituted or unsubstituted arylamino, substituted or unsubstituted heteroarylamino, substituted or unsubstituted aryloxy, substituted or unsubstituted heteroaryloxy, substituted or unsubstituted arylthio, substituted or unsubstituted heteroarylthio, substituted or unsubstituted aralkyl, substituted or unsubstituted heteroaralkyl, substituted or unsubstituted alkylsilyl, substituted or unsubstituted alkylgermyl, the alkyl, alkoxy, alkylthio, alkylamino, heteroalkyl groups having 1 to 30 carbon atoms and preferably 1 to 18 carbon atoms, the alkenyl and alkynyl groups having chain lengths of 2 to 30 carbons, preferably 2 to 18 carbon atoms; the aryl, arylthio, aryloxy having 6 to 60 and preferably 6 to 30 carbon atoms, the arylamino having 6 to 180 carbon atoms, preferably 6 to 120 carbon atoms, the heteroaryl, heteroaryloxy, heteroarylthio having 3 to 120, preferably 3 to 60 carbons atoms, and the heteroarylamino group having 3 to 180 carbon atoms, preferably 3 to 120 carbon atoms;

$R_4$ is independently selected from substituted or unsubstituted ($C_1$-$C_{30}$) alkyl, substituted or unsubstituted ($C_1$-$C_{30}$) alkoxy, substituted or unsubstituted ($C_1$-$C_{30}$) alkylthio, substituted or unsubstituted ($C_1$-$C_{90}$) alkylamino, substituted or unsubstituted ($C_3$-$C_{60}$) aryl such as diarylaminophenyl, diaryltriazinylphenyl, dialkylfluorenyl, diarylfluorenyl, spirobifluorenyl and silsesquioxanyl;

$Ar_1$ is independently selected from substituted or unsubstituted aryl and substituted or unsubstituted heteroaryl, including phenyl, naphthyl, thiophenyl, furanyl, pyrrolyl, pyridyl, thiazolyl, oxadiazolyl, pyrazinyl, fluorenyl, indenofluorenyl, spirobifluorenyl, carbazolyl, indenocarbazolyl, phenoxathinyl, imidazolyl, pyrazolyl, pyrimidinyl, pyridazinyl, indolyl, quinolinyl, quinoxalinyl, naphthyridinyl, phthalazinyl, thiazolyl, dibenzofuranyl, benzofuranyl, benzothiazolyl, benzothiophenyl, benzotriazolyl, benzoxazolyl, dibenzothiophenyl, and anthracenyl;

$Ar_2$ is independently selected from substituted or unsubstituted arylene and substituted or unsubstituted heteroarylene, including phenylene, thienylene, fluorenylene, spirobifluorenylene, indenofluorenylene, pyridylene, bipyridylene, carbazoylene, indenocarbazolylene, benzothiazolylene, oxadiazolylene, pyrrylene, furylene, and these groups with one or more alkyl, or alkoxy, or alkenyl, or alkynyl, or alkylthio, or alkylamino, or arylamino, or heteroarylamino, or aryloxy, or heteroaryloxy, or arylthio, or heteroarylthio, or halogen, or cyano substituents;

m and n are independently 0 or 1, wherein for each p at least one of m and n is 1 and for at least one p, m is 1; and p is from 10 to 2000;

other than a conjugated polymer in which n=0, $Ar_1$=phenyl, $R_2$=5'(2" ethylhexyloxy) and $R_3$=4'(2"ethylhexyloxy).

In another aspect, the invention provides conjugated polymers having formula II

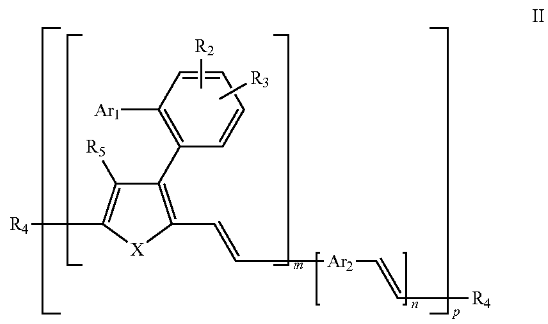

wherein

X is selected from S, NH, $NR_6$, O or $SiR_7R_8$;

$R_2$, $R_3$, $R_5$, $R_6$, $R_7$, and $R_8$ are independently selected from H, halogen, cyano, substituted or unsubstituted alkyl, substituted or unsubstituted alkoxy, substituted or unsubstituted alkylthio, substituted or unsubstituted alkylamino, substituted or unsubstituted alkenyl, substituted or unsubstituted alkynyl, substituted or unsubstituted aryl, substituted or unsubstituted heteroaryl, substituted or unsubstituted arylamino, substituted or unsubstituted heteroarylamino, substituted or unsubstituted aryloxy, substituted or unsubstituted heteroaryloxy, substituted or unsubstituted arylthio, substituted or unsubstituted heteroarylthio, substituted or unsubstituted aralkyl substituted or unsubstituted heteroaralkyl, substituted or unsubstituted alkylsilyl, substituted or unsubstituted alkylgermyl, the alkyl, alkoxy, alkylthio, alkylamino, heteroalkyl groups having 1 to 30 carbon atoms and preferably 1 to 18 carbon atoms, the alkenyl and alkynyl groups having chain lengths of 2 to 30 carbons, preferably 2 to 18 carbon atoms; the aryl, arylthio, aryloxy having 6 to 60 and preferably 6 to 30 carbon atoms, the arylamino having 6 to 180 carbon atoms, preferably 6 to 120 carbon atoms, the heteroaryl, heteroaryloxy, heteroarylthio having 3 to 120, preferably 3 to 60 carbons atoms, and the heteroarylamino group having 3 to 180 carbon atoms, preferably 3 to 120 carbon atoms;

$R_4$ is independently selected from substituted or unsubstituted ($C_1$-$C_{30}$) alkyl, substituted or unsubstituted ($C_1$-$C_{30}$) alkoxy, substituted or unsubstituted ($C_1$-$C_{30}$) alkylthio, substituted or unsubstituted ($C_1$-$C_{90}$) alkylamino, substituted or unsubstituted ($C_3$-$C_{60}$) aryl such as diarylaminophenyl, diaryltriazinylphenyl, dialkylfluorenyl, diarylfluorenyl, spirobifluorenyl and silsesquioxanyl;

$Ar_1$ is independently selected from substituted or unsubstituted aryl and substituted or unsubstituted heteroaryl, including phenyl, naphthyl, thiophenyl, furanyl, pyrrolyl, pyridyl, thiazolyl, oxadiazolyl, pyrazinyl, fluorenyl, indenofluorenyl, spirobifluorenyl, carbazolyl, indenocarbazolyl, phenoxathinyl, imidazolyl, pyrazolyl, pyrimidinyl, pyridazinyl, indolyl, quinolinyl, quinoxalinyl, naphthyridinyl, phthalazinyl, thiazolyl, dibenzofuranyl, benzofuranyl, benzothiazolyl, benzothiophenyl, benzotriazolyl, benzoxazolyl, dibenzothiophenyl, and anthracenyl;

$Ar_2$ is independently selected from substituted or unsubstituted arylene and substituted or unsubstituted heteroarylene, including phenylene, thienylene, pyrrylene, furylene, fluorenylene, spirobifluorenylene, indenofluorenylene, pyridylene, bipyridylene, carbazoylene, indenocarbazolylene, benzothiazolylene, oxadiazolylene, pyrrylene, furylene, and these groups with one or more alkyl, or alkoxy, or alkenyl, or alkynyl, or alkylthio, or alkylamino, or arylamino, or heteroarylamino, or aryloxy, or heteroaryloxy, or arylthio, or heteroarylthio, or halogen, or cyano substituents;

m and n are independently 0 or 1, wherein for each p at least one of m and n is 1 and for at least one p, m is 1; and p is from 10 to 2000;

In other aspects, the invention provides processes for preparing conjugated polymers of formula I or formula II, the processes including the step of polymerizing a PPV-monomer derivative or a heteroaryl-monomer derivative by a dehalogenation condensation reaction or a Wittig reaction.

In another aspect, the invention provides films comprising a conjugated polymer of formula I or formula II. In certain embodiments, the film has a thickness of about 30 nm n to about 200 nm, preferably a thickness of about 60 nm to about 150 nm and more preferably a thickness of about 60 nm to about 120 nm.

In yet another aspect the invention provides an electroluminescent device comprising an emissive layer which comprises one or more polymers according to formula I or formula II. In different embodiments, the device also includes an anode and a cathode, wherein at least one of the anode or the cathode is transparent, semi-transparent or translucent. In some embodiments, the electroluminescent device further comprises one or more of a hole injection layer, an electron injection layer, an electron tunneling layer, an electron transporting layer and a support. In specific embodiments, the electroluminescent device comprises an emissive layer comprising one or more polymers of formula I or formula II wherein the polymers are deposited by solution coating process. In certain embodiments, the emissive layer has a thickness of about 30 nm to about 200 nm, preferably a thickness of about 60 nm to about 150 nm and more preferably a thickness of about 60 nm to about 120 nm.

BRIEF DESCRIPTION OF THE DRAWINGS

In the Figures, which illustrate, by way of example only, embodiments of the present invention:

FIG. 5 depicts a schematic representations of two electroluminescent devices.

DETAILED DESCRIPTION OF THE INVENTION

Figure 1:
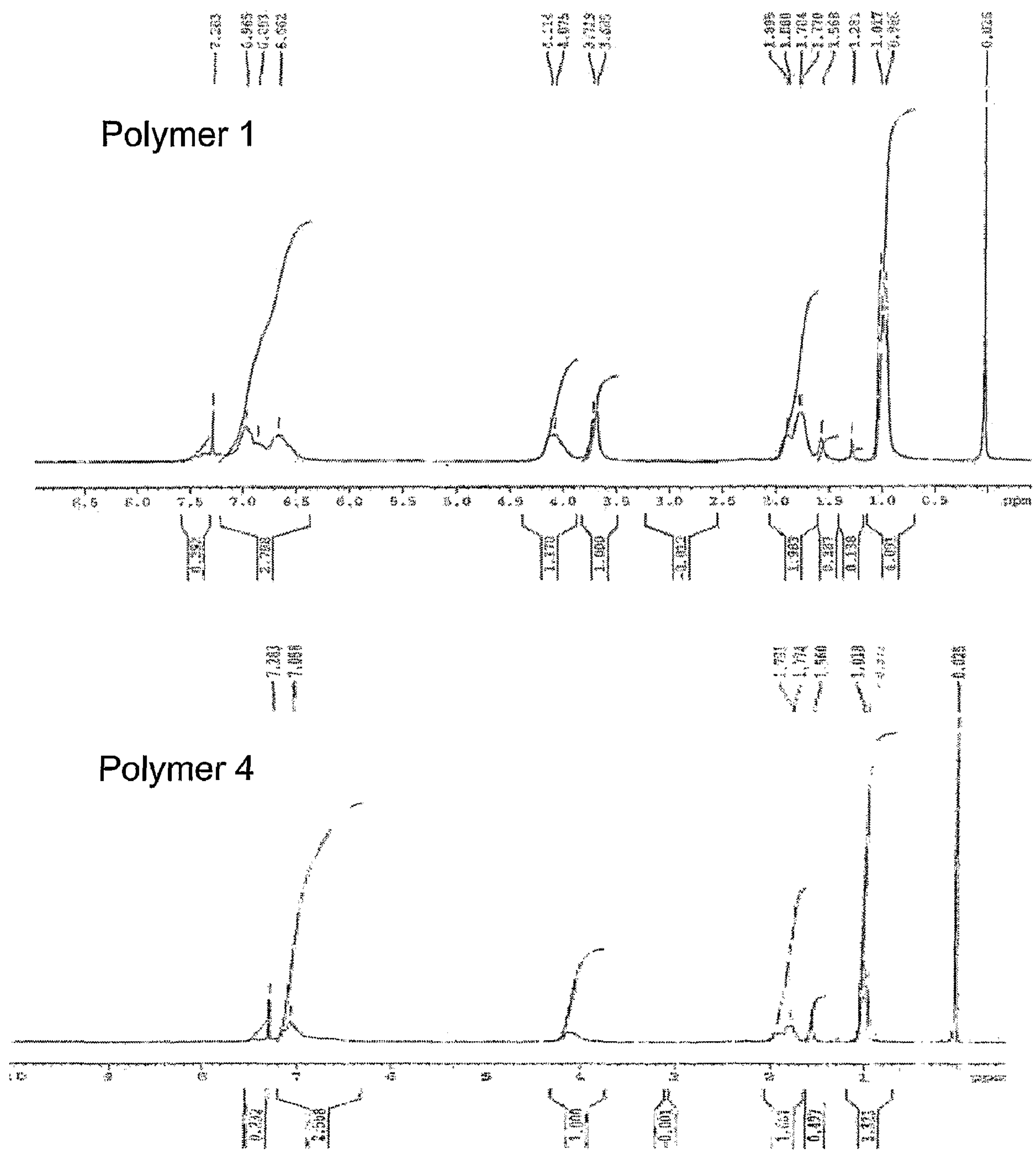
FIG. 1 shows the HNMR spectrum of Polymer 1 and Polymer 4.

There is disclosed conjugated polymers having a general formula I:

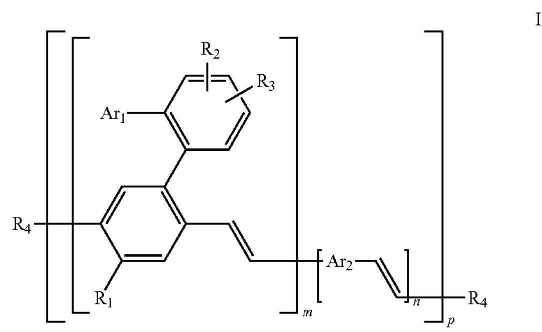

wherein $R_1$, $R_2$ and $R_3$ are independently selected from H, halogen, cyano, substituted or unsubstituted alkyl, substituted or unsubstituted alkoxy, substituted or unsubstituted alkylthio, substituted or unsubstituted alkylamino, substituted or unsubstituted alkenyl, substituted or unsubstituted alkynyl, substituted or unsubstituted aryl, substituted or unsubstituted heteroaryl, substituted or unsubstituted arylamino, substituted or unsubstituted heteroarylamino, substituted or unsubstituted aryloxy, substituted or unsubstituted heteroaryloxy, substituted or unsubstituted arylthio, substituted or unsubstituted heteroarylthio, substituted or unsubstituted aralkyl, substituted or unsubstituted heteroaralkyl, substituted or unsubstituted alkylsilyl, substituted or unsubstituted alkylgermyl, the alkyl, alkoxy, alkylthio, alkylamino, heteroalkyl groups having 1 to 30 carbon atoms and preferably 1 to 18 carbon atoms, the alkenyl and alkynyl groups having chain lengths of 2 to 30 carbons, preferably 2 to 18 carbon atoms; the aryl, arylthio, aryloxy having 6 to 60 and preferably 6 to 30 carbon atoms, the arylamino having 6 to 180 carbon atoms, preferably 6 to 120 carbon atoms, the heteroaryl, heteroaryloxy, heteroarylthio having 3 to 120, preferably 3 to 60 carbons atoms, and the heteroarylamino group having 3 to 180 carbon atoms, preferably 3 to 120 carbon atoms;

$R_4$ is independently selected from substituted or unsubstituted ($C_1$-$C_{30}$) alkyl, substituted or unsubstituted ($C_1$-$C_{30}$) alkoxy, substituted or unsubstituted ($C_1$-$C_{30}$) alkylthio, substituted or unsubstituted ($C_1$-$C_{90}$) alkylamino, substituted or unsubstituted ($C_3$-$C_{60}$) aryl such as diarylaminophenyl, diaryltriazinylphenyl, dialkylfluorenyl, diarylfluorenyl, spirobifluorenyl and silsesquioxanyl;

$Ar_1$ is independently selected from substituted or unsubstituted aryl and substituted or unsubstituted heteroaryl, including phenyl, naphthyl, thiophenyl, furanyl, pyrrolyl, pyridyl, thiazolyl, oxadiazolyl, pyrazinyl, fluorenyl, indenofluorenyl, spirobifluorenyl, carbazolyl, indenocarbazolyl, phenoxathinyl, imidazolyl, pyrazolyl, pyrimidinyl, pyridazinyl, indolyl, quinolinyl, quinoxalinyl, naphthyridinyl, phthalazinyl, thiazolyl, dibenzofuranyl, benzofuranyl, benzothiazolyl, benzothiophenyl, benzotriazolyl, benzoxazolyl, dibenzothiophenyl, and anthracenyl;

$Ar_2$ is independently selected from substituted or unsubstituted arylene and substituted or unsubstituted heteroarylene, including phenylene, thienylene, fluorenylene, spirobifluorenylene, indenofluorenylene, pyridylene, bipyridylene, carbazoylene, indenocarbazolylene, benzothiazolylene, oxadiazolylene, pyrrylene, furylene and these groups with one or more alkyl, or alkoxy, or alkenyl, or alkynyl, or alkylthio, or alkylamino, or arylamino, or heteroarylamino, or aryloxy, or heteroaryloxy, or arylthio, or heteroarylthio, or halogen, or cyano substituents;

m and n are independently 0 or 1, wherein for each p at least one of m and n is 1 and for at least one p, m is 1; and p is from 10 to 2000;

other than a conjugated polymer in which n=0, $Ar_1$=phenyl, $R_2$=5'(2"ethylhexyloxy) and $R_3$=4'(2" ethylhexyloxy).

There is also disclosed a conjugated polymer having a general formula II:

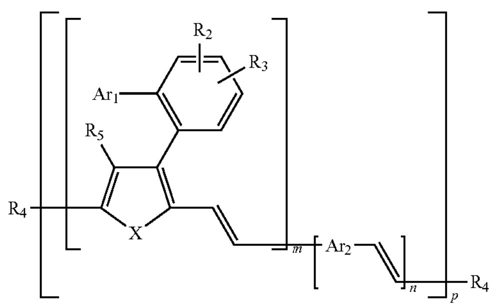

wherein

X is selected from S, NH, $NR_6$, O or $SiR_7R_9$;

$R_2$, $R_3$, $R_5$, $R_6$, $R_7$ and $R_8$ are independently selected from H, halogen, cyano, substituted or unsubstituted alkyl, substituted or unsubstituted alkoxy, substituted or unsubstituted alkenyl, substituted or unsubstituted alkynyl, substituted or unsubstituted alkylamino or substituted or unsubstituted arylamino, substituted or unsubstituted heteroarylamino, substituted or unsubstituted alkylthio, substituted or unsubstituted aryloxy, substituted or unsubstituted heteroaryloxy, substituted or unsubstituted arylthio, substituted or unsubstituted heteroarylthio, substituted or unsubstituted aryl, substituted or unsubstituted heteroalkyl, substituted or unsubstituted aralkyl, substituted or unsubstituted alkylsilyl, substituted or unsubstituted alkylgermyl, the alkyl, alkoxy, alkylthio, alkylamino, heteroalkyl groups having 1 to 30 carbon atoms and preferably 1 to 18 carbon atoms, the alkenyl and alkynyl groups having chain lengths of 2 to 30 carbons, preferably 2 to 18 carbon atoms; the aryl, arylthio, aryloxy groups having 6 to 60 and preferably 6 to 30 carbon atoms, the arylamino group having 6 to 180 carbon atoms, preferably 6 to 120 carbon atoms, the heteroaryl, heteroaryloxy, heteroarylthio having 3 to 120, preferably 3 to 60 carbons atoms, and the heteroarylamino group having 3 to 180 carbon atoms, preferably 3 to 120 carbon atoms;

$R_4$ is independently selected from substituted or unsubstituted ($C_1$-$C_{30}$) alkyl, substituted or unsubstituted ($C_1$-$C_{30}$) alkoxy, substituted or unsubstituted ($C_1$-$C_{30}$) alkylthio, substituted or unsubstituted ($C_1$-$C_{90}$) alkylamino, substituted or unsubstituted ($C_3$-$C_{60}$) aryl such as diarylaminophenyl, diaryltriazinylphenyl, dialkylfluorenyl, diarylfluorenyl, spirobifluorenyl and silsesquioxanyl;

$Ar_1$ is independently selected from substituted or unsubstituted aryl and substituted or unsubstituted heteroaryl, including phenyl, naphthyl, thiophenyl, furanyl, pyrrolyl, pyridyl, thiazolyl, oxadiazolyl, pyrazinyl, fluorenyl, indenofluorenyl, spirobifluorenyl, carbazolyl, indenocarbazolyl, phenoxathinyl, imidazolyl, pyrazolyl, pyrimidinyl, pyridazinyl, indolyl, quinolinyl, quinoxalinyl, naphthyridinyl, phthalazinyl, thiazolyl, dibenzofuranyl, benzofuranyl, benzothiazolyl, benzothiophenyl, benzotriazolyl, benzoxazolyl, dibenzothiophenyl, and anthracenyl;

$Ar_2$ is independently selected from substituted or unsubstituted arylene and substituted or unsubstituted heteroarylene, including phenylene, thienylene, pyrrylene, furylene, fluorenylene, spirobifluorenylene, indenofluorenylene, pyridylene, bipyridylene, carbazoylene, indenocarbazolylene, benzothiazolylene, oxadiazolylene, and these groups with one or more alkyl, or alkoxy, or alkenyl, or alkynyl, or alkylthio, or alkylamino, or arylamino, or heteroarylamino, or aryloxy, or heteroaryloxy, or arylthio, or heteroarylthio, or halogen, or cyano substituents;

m and n are independently 0 or 1, wherein for each p at least one of m and n is 1 and for at least one p, m is 1; and p is from 10 to 2000.

As used herein, "alkyl" refers to straight or branched, cyclic or non-cyclic chain alkyl; "substituted alkyl" refers to alkyl radicals further bearing one or more substituents or heteroatoms, such as, for example, hydroxy, thio, ($C_1$-$C_{18}$) alkoxy, ($C_6$-$C_{60}$) aryl, ($C_2$-$C_{60}$) heteroaryl, halogen, ($C_1$-$C_{18}$) perhaloalkyl, ($C_1$-$C_{18}$) perhaloalkoxy, cyano, nitro, amino, carboxyl, carboxyalkyl, carbamate, sulfonyl, sulfonamide, silicon, boron, phosphorous, sulfur, oxygen, nitrogen and the like. The substituents may also themselves be substituted.

As used herein, "alkoxy" refers to straight or branched, cyclic or non-cyclic, alkyl chains having an oxy radical group; "substituted alkoxy" refers to alkoxy radicals further bearing one or more substituents as set forth above.

As used herein, "alkylthio" refers to straight or branched, cyclic or non-cyclic, alkyl chains having a thio radical group; "substituted alkylthio" refers to alkylthio radicals further bearing one or more substituents as set forth above.

As used herein, "alkylamino" refers to an amino radical having one or more straight or branched, cyclic or non-cyclic alkyl chains; "substituted alkylamino" refers to alkylamino radicals further bearing one or more substituents as set forth above.

As used herein, "alkenyl" refers to straight or branched, cyclic or non-cyclic hydrocarbyl chain radicals having at least one carbon-carbon double bond; "substituted-alkenyl" refers to alkenyl radicals further bearing one or more substituents as set forth above.

As used herein, "alkynyl" refers to straight or branched, cyclic or non-cyclic hydrocarbyl chain radicals having at least one carbon-carbon triple bond; "substituted alkynyl" refers to alkynyl radicals further bearing one or more substituents as set forth above.

As used herein, "aryl" refers to an aromatic radical having 6 to 60 carbon atoms; "substituted aryl" refers to aryl radicals further bearing one or more substituents as set forth above.

As used herein, "heteroaryl" refers to aromatic radicals having in the range of 2 to 60 carbon atoms having one or more, for example 1 to 30 heteroatoms (e.g., N, O, S, Si, P, B or their combination) as part of the ring structure; "substituted heteroaryl" refers to a heteroaryl radical further bearing one or more substituents as set forth above.

As used herein, "arylamino" refers to an amino radical having one or more aryl groups; "substituted arylamino" refers to a arylamino radical further bearing one or more substituents as set forth above.

As used herein, "heteroarylamino" refers to an amino radical having one or more heteroaryl groups; "substituted heteroarylamino" refers to a heteroarylamino radical further bearing one or more substituents as set forth above.

As used herein, "aryloxy" refers to an oxy radical having an aryl group; "substituted aryloxy" refers to an arlyoxy radical further bearing one or more substituents as set forth above.

As used herein, "heteroaryloxy" refers to an oxy radical having a heteroaryl group; "substituted heteroaryloxy" refers to a heteroaryloxy radical further bearing one or more substituents as set forth above.

As used herein, "arylthio" refers to a thio radical having an aryl group; "substituted arylthio" refers to an arylthio radical further bearing one or more substituents as set forth above.

As used herein, "heteroarylthio" refers to a thio radical having a heteroaryl group; "substituted heteroarylthio" refers to a heteroarylthio radical further bearing one or more substituents as set forth above.

As used herein, "aralkyl" refers to an alkyl radical having one or more aryl groups; "substituted aralkyl" refers to an aralkyl radical further bearing one or more substituents as set forth above.

As used herein, "heteroaralkyl" refers to a alkyl radical having one or more heteroaryl groups; "substituted heteroaralkyl" refers to a heteroaralkyl radical further bearing one or more substituents as set forth above.

As used herein, "alkylsilyl" refers to a silyl radical having one or more alkyl groups; "substituted alkylsilyl" refers to an alkylsilyl radical further bearing one or more substituents as set forth above.

As used herein, "alkylgermyl" refers to a germyl radical having one or more alkyl groups; "substituted alkylgermyl" refers to an alkylgermyl radical further bearing one or more substituents as set forth above.

As would be understood by a person skilled in the art the aforementioned radicals would, unless the context dictates otherwise, include mono-, di- and tri-substituted radicals. For example, the term "alkylamino" would include, unless the context dictates otherwise, alkylamino, dialkylamino and trialkylamino radicals. As would be further understood by a person skilled in the art, a radical such as an N-aryl-N-alkylamino radical would be understood by a skilled person to be both a "alkylamino" and an "arylamino" radical.

As used herein, "non-nucleophilic base" refers to anions that are sterically hindered preventing them from acting as nucleophiles, such as, for example tert-butyl and tert-butoxide.

As used herein, "PPV-monomer derivative" refers to biphenyl-containing monomers that may be polymerized to form various embodiments of a polymer of formula I. PPV-monomer derivatives contain a central 1,4-dimethylenebenzene element with an $R_1$ group on the C5 position of the central benzene ring, a side chain phenyl group on the 2 position of the central benzene ring, an $Ar_1$ group on the 2' position of the side chain phenyl group, $R_2$ on the 3' or 4' position of the side chain phenyl group and $R_3$ on the 4' or 5' of the side chain phenyl group. As will be understood by a person skilled in the art, the PPV monomer derivatives may be further modified depending on the synthetic route used to prepare the conjugated polymer. For example, where the polymer is to be prepared by a dehydrohalogenation reaction, such as, for example a Gilch condensation, the PPV-monomer derivative will be the appropriate 1,4-bis(halomethyl) derivatives. Alternatively, where the conjugated polymer is to be synthesized by a Wittig reaction, the PPV-monomer derivatives will be the appropriate triphenyl phosphonium salts of a 1,4-bis(halomethyl)benzene derivative and the 1,4-dialdehydes of the appropriate PPV-monomer derivatives.

As used herein, "heteroaryl-monomer derivative" refers heteroaryl containing monomers that may be polymerized to form various embodiments of a polymer of formula II. In specific embodiments, a heteroaryl-monomer derivative contains a central 2,5-dihalomethyl substituted 5-membered heteroaryl ring with a side chain phenyl group on the 3 position of the heteroaryl ring, an $Ar_1$ group on the 2' position of the side chain phenyl group, $R_2$ on the 3' or 4' position of the side chain phenyl group and $R_3$ on the 4' or 5' of the side chain phenyl group. In some embodiments, the heteroaryl ring will be a thienyl group. As will be understood by a person skilled in the art, the heteroaryl-monomer derivatives may be further modified depending on the synthetic route used to prepare the conjugated polymer. For example, where the polymer is to be prepared by a dehydrohalogenation reaction, such as, for example a Gilch condensation, the heteroaryl-monomer derivative will be the appropriate 2,5-bis(halomethyl) derivatives. Alternatively, where the conjugated polymer is to be synthesized by a Wittig reaction, the PPV-monomer derivatives will be the appropriate triphenyl phosphonium salts of a 2,5-bis(halomethyl)benzene derivative and the 2,5-dialdehydes of the appropriate heteroaryl-monomer derivative.

In different embodiments, $Ar_1$ and $R_2$ of the polymers of general formula I or general formula II are, for at least one m, further covalently linked to each other to form a substituted or unsubstituted 6 membered aromatic ring, a substituted or unsubstituted 5 membered heteroaromatic ring, a substituted or unsubstituted saturated ring or a substituted or unsubstituted unsaturated ring which may optionally contain heteroatoms.

The polymers of formula I contain a bulky side group at position 2 of the phenylene ring of the polymer backbone. The bulky group, for example, a biphenyl group, may guide the propagation of the growing polymer chain during polymerization, favoring head-to-tail polymerization. The effects of the bulky group disfavouring the formation of structural defects such as TBB may be mediated through electronic or steric effects during the condensation step. The polymers may contain decreased levels of TBB in the polymer backbone, which has been confirmed by the NMR spectrum of two exemplary polymers of the invention (see FIG. 1). The successful suppression of the structural defects in the polymer backbone is advantageous for fabrication of stable and long lifespan of light emitting devices.

In general, the effect of bulky substituents on the regularity of the polymer primary structure can be applied in other conjugated systems. The polymers of formula II similarly contain a bulky side group at position 3 of the 5-membered heteroaryl group of the polymer backbone. The bulky group, for example, a biphenyl group, may guide the propagation of polymer chain during polymerization, favoring head-to-tail polymerization. However, bulky substituents may also reduce the molecular weight of the polymers after polymerization, which may not be desirable for light emitting devices. This side effect may be more severe in polymers having repeating adjacent aryl or heteroaryl groups, such as, for example, PPP, PT, poly(analines) because of the existing steric effects of the two neighbouring aryl groups. In poly(arylenevinylene) or poly(heteroarylenevinylene) polymers such as, for example, poly(thienylenevinylene), the polymer backbone is almost in a planar conformation, and the steric effects of the backbone itself may be very small. The undesirable effects of bulky substituents on polymer length maybe overcome by appropriately selecting polymerization strategies, for example the Gilch dehalogenation condensation reaction, which may generate polymers very high molecular weight in the range of 10 000 to 1 000 000 Daltons.

Figure 2:
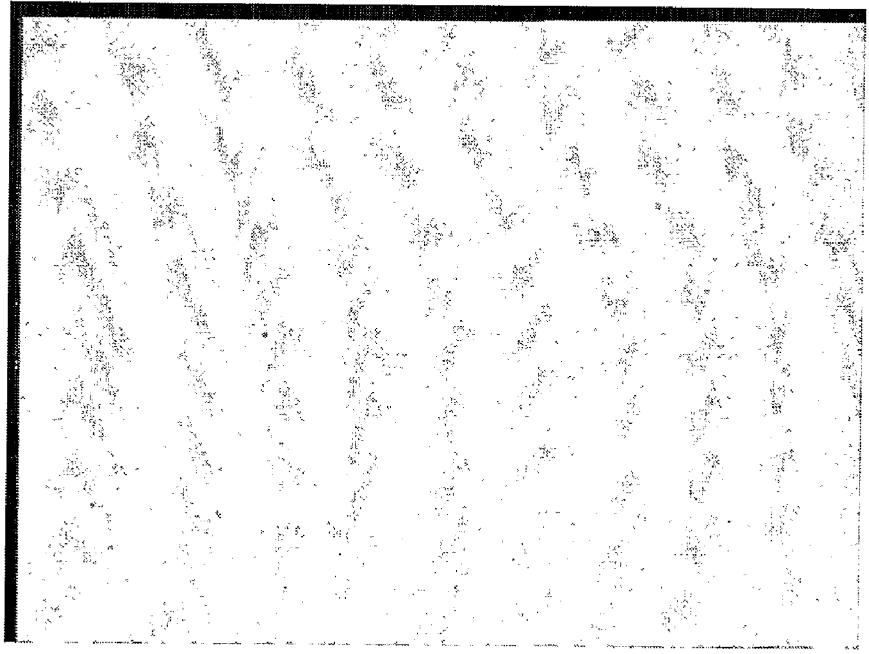
FIG. 2 depicts optical micrographs of films prepared by spin coating Polymer 1 (FIG. 1*a*) and Polymer 4 (FIG. 1*b*) from toluene.

Different embodiments of the polymers of general formula I or formula II can show good solubility, up to 10 mg/ml, in common organic solvents at room temperature such as, for example, THF, chloroform, toluene, xylene, dichlorobenzene, 1,1,2,2,tetrachloroethane, mesitylene and mixtures thereof, which may be processed into films, including thin films, by methods known to a person skilled in the art, for example, such as solution coating methods, such as for example, spin coating, casting, microgravure coating, gravure coating, bar coating, roll coating, wire bar coating, dip coating, spray coating, screen printing, flexo printing, offset printing or inkjet printing. Films of the electroluminescent polymers of formula I or formula II preferably have a thickness of about 30 nm to about 200 nm, more preferably a thickness of about 60 nm to about 150 nm and most preferably a thickness of about 60 nm to about 120 nm. Optical micrographs of films formed by spin coating polymers from toluene are depicted in FIG. 2

The polymers of formula I or formula II may be prepared by polymerizing one or more suitable monomers, by a number of different routes known to a person skilled in the art, such as, for example, the Gilch dehalogenation condensation (*Journal of Polymer Sci*: Part A-1 (1966) 4: 1337-1349), the Wittig reaction (Drefalh et al (1970) Makromol. Chem. 131: 89) and electrochemical polymerization. For example, in the Wittig reaction, terephthalaldehyde may be reacted with the triphenyl phosphonium salt of a 1,4 bis(chloromethyl)benzene derivative in the presence of tert-butoxide to generate PPV. Accordingly, polymers of formula I, for example, may be produced by a Wittig reaction employing suitably modified derivatives of terephthalaldehyde and a triphenylphosphonium salt of 1,4-bis(halomethyl)benzene.

The Wittig reaction can produce PPV polymers with an average molecular weight of about 10 000, whereas in the Gilch method, polymers with average molecular weight of 10 000 to about 1 000 000 are attainable (See U.S. Pat. No. 6,368,732). As would be understood by a person skilled in the art, high molecular weight films are preferable for producing uniform, high quality films, and for reducing the joule heat when driving an electroluminescent device containing a PLED.

The true "monomer" in the dehalogenation condensation is believed to be the para-quinodimethane product produced by a non-nucleophilic base-mediated elimination of one equivalent of HCl from 1,4-bis(halomethyl)benzene, for example by potassium tert-butoxide. The p-quinodimethane derivative polymerizes into a polymer that still contains chlorine in the main chain. A second equivalent of base may then remove HCl from the precursor polymer to produce PPV (Becker et al 2000, *Advanced Materials* (2000), 12: 42).

Which chlorine atom is eliminated by the first equivalent of the base in a nonsymmetrical 1,4-bis(halomethyl)benzene monomer is believed to influence subsequent polymerization steps. The dominating influence between regular head-to-tail polymerization is thought to arise from the chlorine atom. The steric and electronic effects of the chlorine atom can lead to high selectivity for the regular head-to-tail pathway, however, the efficiency of the regular head-to-tail polymerization may be decreased by certain bulky side groups that sterically interfere with regular head-to-tail polymerization (Becker et al 2000, *Advanced Materials* (2000), 12: 42).

Figure 3:
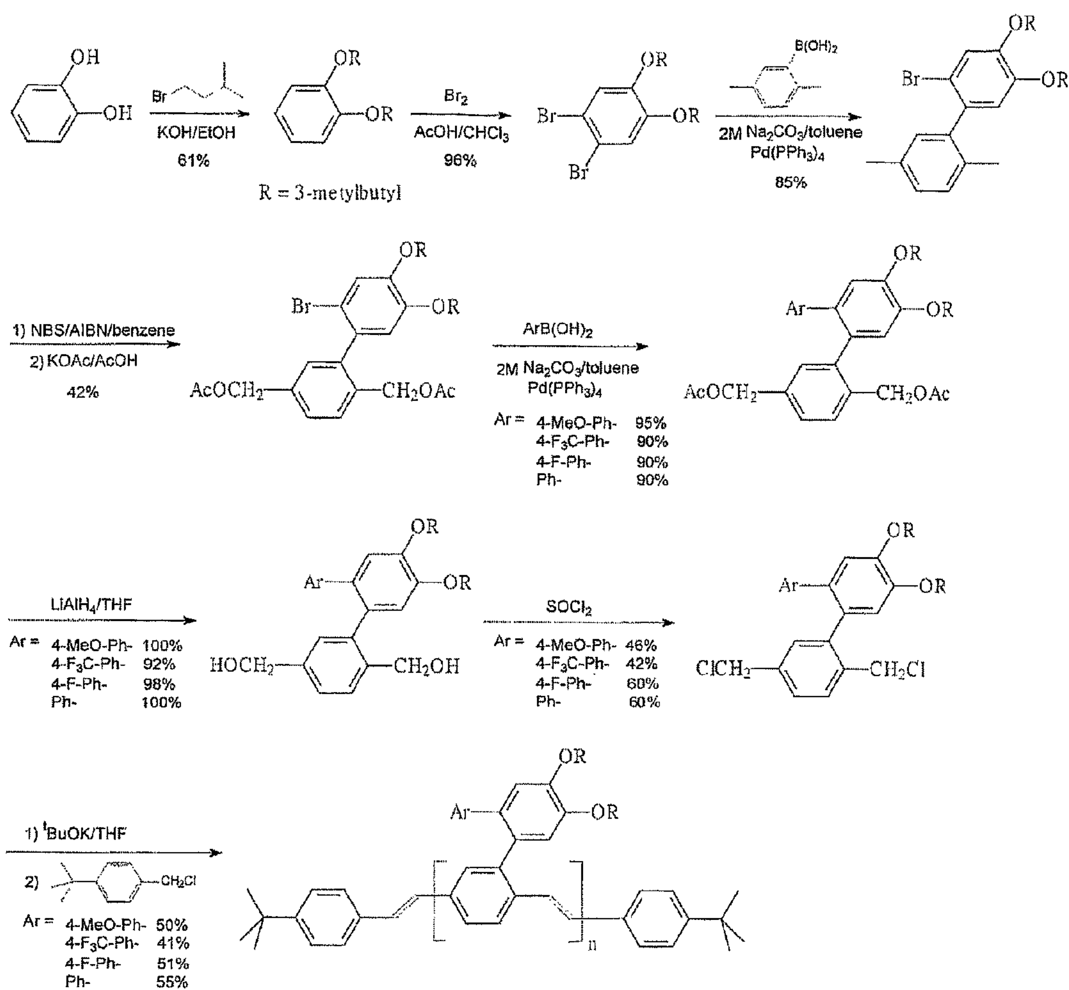
FIG. 3 shows the preparation scheme of the homopolymers.

Monomers that may be used to prepare polymers according to formula I may be produced according to methods known in the art. For example, U.S. Pat. No. 6,368,732 discloses a method of making a number of 1,4-bis(bromomethyl) 2-(phenyl)benzene derivatives which may be used to prepare the polymers by dehalogenation condensation. Polymerization of other suitable monomers is described in WO 99/21936, which discloses methods for synthesizing a number of aryl substituted 1,4-bis(halomethyl)benzene derivatives, and US 2002/0093005 which describes methods of making 1,4 bis (halomethyl)benzene derivatives. Alternatively, the 1,4-bis (chloromethyl)-2-(aryl)benzene derivatives and their resulting polymers may be synthesized according to scheme illustrated in FIG. 3. Catechol was first etherified with 3-methylbutyl bromide in ethanol in the presence of a base, which resulted in 1,2-bis(3'-methylbutoxy)benzene with a yield 61%. Incorporation of two alkoxy chains into the PPV monomers may enhance the solubility of the resulting polymers. This diether compound was brominated with bromine to give 4,5-bis(3'-methylbutoxy)-1,2-dibromobenzene with high yield. The dibromo compound was coupled with p-xylene boronic acid through Suzuki reaction to afford high yield (85%) of monosubstituted 2-(4',5'-bis(3"-methylbutoxy)-2'-bromo)phenyl-p-xylene. This monosubstituted p-xylene structure was converted to 2-(4',5'-bis(3"-methylbutoxy)-2'-bromo)phenyl-α,α'-diacetoxy-p-xylene first by N-bromosuccinimide (NBS) bromination and then esterification by potassium acetate in acetic acid to give a total yield of 42%. Another alternative approach to achieve this functional group transfer is to oxidize the p-xylene compound to di-acid compound then followed by esterification. Then another Suzuki coupling reaction was conducted to introduce another aromatic ring p-Methoxy phenyl, p-trifluoromethylphenyl, p-fluorophenyl and phenyl itself have been incorporated respectively with very high yield (>90%). These aromatic groups may enhance the solubility of the resulting polymers. After reduction of the acetoxy group to hydroxy group, the monomers were obtained by chlorification of the hydroxyl compounds with thionyl chloride. The polymers then were prepared through dehalogenation condensation reaction in the presence of potassium tert-butoxide in dry THF to yield yellow fibrous polymers. Monomers that may be used to prepare polymers according to formula II may be prepared by analogous methods.

The dehalogenation condensation reaction may proceed in the presence of an excess base, such as, for example, potassium ter-butoxide, or in the presence of about one equivalent of the base, as in the chlorine precursor route (CPR) (Swatos et al. (1990), *Polym. Prep* 31(1):505).

Other organic solvents may be used for the dehalogenation condensation reaction, and these solvents preferably have a solvent polarity equal to or greater than that of tetrahydrofuran (THF). Solvent polarity may be determined relative to that of water (Wessling (1985), *J. Polym. Sci. Symp* 72:55).

Figure 4:
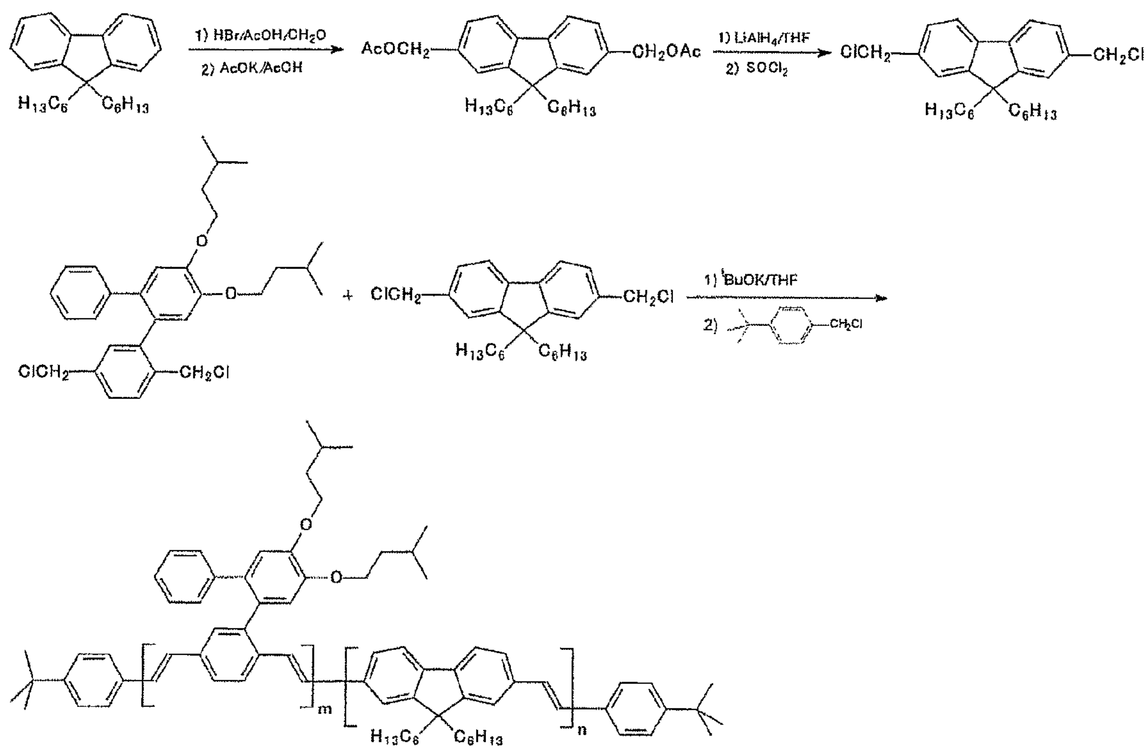
FIG. 4 shows the preparation scheme of a statistical copolymer.

A person skilled in the art would appreciate that where n is not zero, general formulas I and II would cover statistical and random copolymers. Statistical copolymers based on the monomers described above may be prepared in a similar manner. "Statistical Copolymer" refers to a copolymer in which the sequential distribution of the monomeric units of the copolymer obeys known statistical laws, and includes a random copolymer. "Random copolymer" refers to a copolymer in which the probability of finding a given monomeric unit at any given site in the chain is independent of the nature of the adjacent units. An example of preparing poly[2-(2'-phenyl-4',5'-bis(3"-methylbutoxy))phenyl-1,4-phenylene vinylene-co-9,9-dihexyl-2,7-fluorenylene vinylene] by co-polymerization of 2-(4',5'-bis(3"-methylbutoxy)-2'-phenyl)phenyl-α,α'-dichloro-p-xylene and 2,7-dichloromethyl-9,9-dihexyl-fluorene is illustrated in FIG. 4. As will be apparent to a skilled person, variation of the feed ratio of the co-monomers or incorporation of other types of monomers, such as, for example, substituted or unsubstituted phenylene vinylene, substituted or unsubstituted thienyl vinylene, substituted or unsubstituted pyridylene vinylene, substituted or unsubstituted carbazolyene vinylene can be used to produce copolymers with desired optical electronic or other desired properties. For example, one monomer could be electron rich segment and another monomer could be electron deficient segment. For example, if the comonomer is cyano substituted dihalomethylbenzene, the resulting copolymers could have well defined bandgaps and energy levels by varying the feed ratio of the two monomers. If electroluminescent polymers with more orange emission are desired, PPV-monomer derivatives may be copolymerized with (2-methoxy-5(3',7'-dimethyl octyloxy-1,4 bis(chloromethyl)benzene) or 2-methoxy-5-(2'-ethylhexyloxy-1,4-bis(chloromethyl)benzene. The optical properties of the resulting copolymers may be determined by methods known to those skilled in the art, for example by obtaining the photoluminescence spectra of polymer solutions or films.

A similar dehalogenation condensation reaction or Wittig reaction may be employed to prepare poly(heteroarylenevinylene) polymers of formula II, wherein at least one monomer has a bulky group, such as a biphenyl group, attached at the 3-position of the heteroarylene ring within the monomer backbone. Without being limited to any particular theory, the introduction of a bulky group at the 3 position is expected to increase the efficiency of head-to-tail polymerization of the di(halomethyl)heteroarylene containing monomers that may be used to prepare polymers of formula II. In certain embodiments, the poly(heteroarylenevinylene) backbone of formula II comprises thienylenevinylene units. Methods of making PTV-based polymers have been described (Lee et al. (2003) *Macromol Rapid Commun* 24: 522-26). In various embodiments, the polymerization is effected in an organic solvent having a polarity equal to or greater than that of THF, and in specific embodiments, the polymerization of the heteroaryl-monomer derivative is effected in THF. For example, 2.2 equivalents of a 1M tert-butoxide base may be added to 2,5-bis(halomethyl)thiophenyl derivatives in THF at a low temperature, for example, about −15° C., and the solution gradually heated to room temperature over 4 hours. The presence of a 3', aryl group is expected to reduce the probability that the monomer will undergo an undesired elimination reaction and this effect of the 3' aryl group may be greater than the effect of the alkylsilyl group disclosed in Lee at al. ((2003) *Macromol Rapid Commun* 24: 522-26).

Figure 5A:
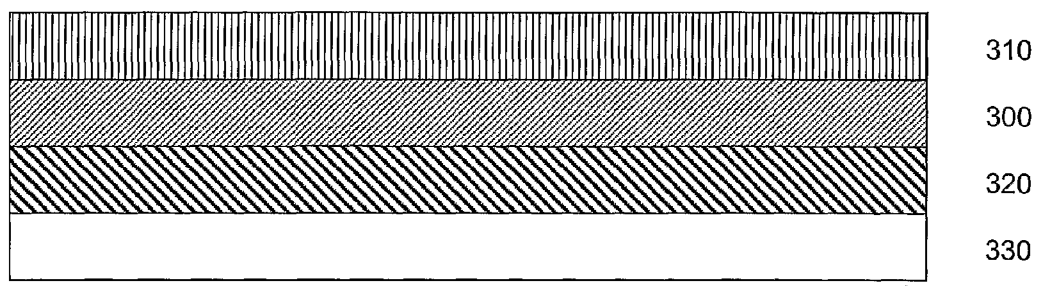
FIG. 5A depicts a single layer support/anode/polymer/cathode device and FIG. 5B depicts a support/anode/hole injecting layer/polymer/electron injecting layer/electron tunneling layer/cathode electroluminescent device.
Figure 5B:
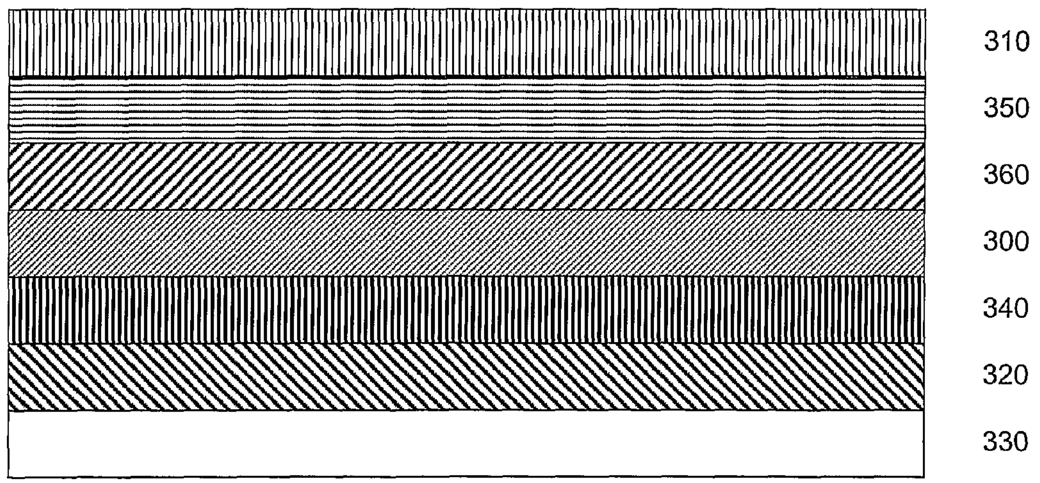

The polymers of formula I or formula II may be good candidates for polymer light emitting devices (PLED) applications. Methods of constructing polymer light emitting devices are known and have been described elsewhere (WO 01/62716; U.S. Pat. No. 6,458,909). As will be appreciated by a skilled person, generally, and with reference to FIGS. 5A and 5B, PLEDs consist of an emissive layer (300) comprising one or more electroluminescent polymers disposed between an electron injecting cathode (310) and a hole injecting electrode anode (320). In certain embodiments, one or more of the anode and the cathode may be deposited on a support (330), which may be transparent, semi-transparent or translucent. As would be understood by a person skilled in the art, the anode or the cathode may be transparent, semi-transparent or translucent, and the transparent, semi-transparent or translucent electrode may be disposed on a transparent, semi-transparent or translucent support. In certain embodiments, the anode is transparent, semi-transparent or translucent and is disposed on a transparent semi-transparent or translucent support. The thickness of the layers in FIGS. 5A and 5B are not depicted to scale.

The transparent, semi-transparent or translucent support (330) may be rigid, for example quartz or glass, or may be flexible polymeric substrates. Examples of flexible transparent semi-transparent or translucent supports include, but are not limited to, polyimides, polytetrafluoroethylenes, polyethylene terephthalates, polyolefins such as polypropylene and polyethylene, polyamides, polyacrylonitrile, polymethacrylonitrile, polystyrenes, polyvinyl chloride, and fluorinated polymers such as polytetrafluoroethylene.

The anode (320) may be a thin film of gold or silver, or more preferably indiumtinoxide (ITO). ITO is particularly suitable as an anode due to its high transparency and electrical conductivity. In various embodiments, the anode (320) may be provided on the transparent semi-transparent or translucent support (330) by methods known in the art, such as vacuum evaporation, sputtering or chemical vapour deposition.

The emissive layer (300) may be provided as a film on the anode by known solution coating techniques such as, for example, spin coating, casting, microgravure coating, gravure coating, bar coating, roll coating, wire bar coating, dip coating, spray coating, screen printing, flexo printing, offset printing or inkjet printing The resulting electroluminescent polymer film preferably has a thickness of about 30 nm to about 200 nm, more preferably a thickness of about 60 nm to about 150 nm and most preferably a thickness of about 60 nm to about 120 nm. A skilled person would readily appreciate how to control the thickness of the resulting film by, for example, controlling the duration of coating or the amounts of the electroluminescent polymer.

The cathode (310) may be a low work function metal or metal alloy, including, for example, barium, calcium, magnesium, indium, aluminum, ytterbium, an aluminum:lithium alloy, or a magnesium:silver alloy, such as, for example an alloy wherein the atomic ratio of magnesium to silver is about 10:1 (U.S. Pat. No. 6,791,129) or an alloy where the atomic ratio of lithium to aluminum is about 0.1:100 to about 0.3:100 (Kim et al. (2002) *Curr. Appl. Phys.* 2(4):335-338; Cha et al (2004) *Synth. Met.* 143(1): 97; Kim et al (2004) *Synth. Met.* 145(2-3): 229). The cathode (310) may be provided on the emissive layer (300) by methods known in the art, such as vacuum evaporation, sputtering or chemical vapour deposition. When barium or calcium is selected as the cathode (310), it may be advantageous to further cover the barium or calcium layer with a protective layer, for example an epoxy or inert metal, for example silver.

The PLED may further contain one or more compounds that improve the charge-injecting and/or charge transport capabilities of holes or electrons. These additional layers may improve the service life, luminous efficiency or power efficiency of the PLED. A hole injection layer (340) may be provided between the anode (320) and the emissive layer (300). Suitable materials for hole injection layers include, for example, aromatic tertiary amines, polyvinylcarbazole, quinacridone, porphyrins, phthalocyanines, polyanilines, poly-3,4-ethylenedioxythiophene or poly-3,4-ethylenedioxythiophene doped with poly(styrenesulfonate) (PEDOT:PSS). The organic hole injection layers may be deposited on the anode by methods known in the art, for example, such as spin coating or inkjet printing, An electron tunneling layer (350) may be disposed between the emissive layer (300) comprising one or more electroluminescent polymers and the cathode (310) to enhance electron injection. Suitable materials for an electron tunneling layer (350), include, for example, LiF, parylene and $MgF_2$. The electron tunneling layer (350) may be deposited by known methods, for example, vacuum deposition.

An electron injection and/or electron transport layer (360) may be disposed between the emissive layer (300) and the electron tunneling layer (350) or the cathode (310). Suitable materials for the electron injection/electron transport layer include, for example, aluminum tris(8-hydroxyquinoline), 2-(4-biphenyl)-5-(4-tert-butylphenyl)-1,3,4,oxadiazole, or 2,2',2"-(1,3,5-benzenetriyl)tris-[1-phenyl-1H-benzimidazole] (TPBI).

FIG. 5A depicts a single layer electroluminescent device. FIG. 5B depicts a multi layer electroluminescent device. A person skilled in the art would appreciate that an electroluminescent device may omit one or more of the electron tunneling layer (350), the electron injection/electron transport layer (360), the hole injecting layer (340) and the support (330), and FIGS. 5A and 5B are not intended to limit the invention to a device containing all of the depicted layers.

Polymer light emitting devices according to one embodiment of the invention have been fabricated using the disclosed polymers as the emitting layer and PEDOT:PSS as the hole injection layer, ITO as the anode and calcium as the cathode. Between the cathode and emitting layer, a thin electron tunneling layer comprising LiF may be added to enhance electron injection. Polymers containing p-methoxyphenyl groups, p-trifluoromethylphenyl and p-fluorophenyl groups showed better solubility in toluene and demonstrated higher efficiency than a polymer with only phenyl groups on the side chains. The p-methoxyphenyl, p-trifluoromethylphenyl and p-fluorophenyl polymers are green light emitters with a peak wavelength of about 505 nm with a side peak around 540 nm.

Figure 6:
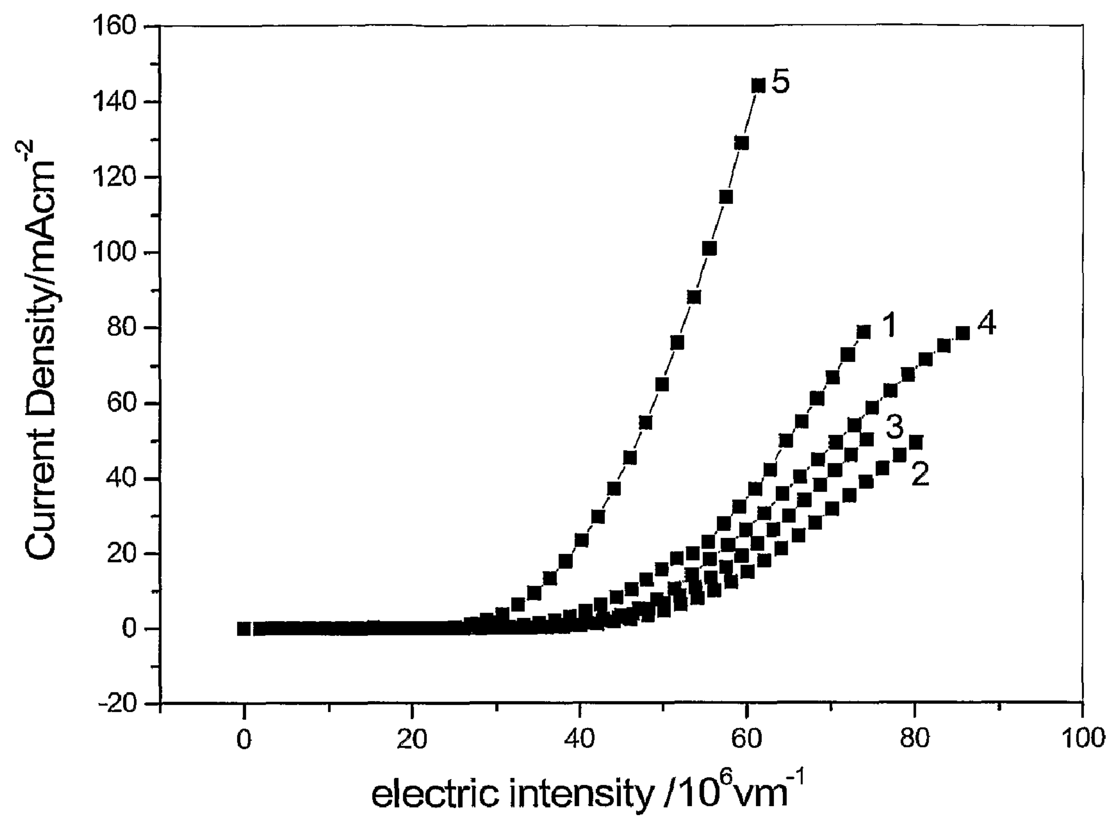
FIG. 6 shows I-V plots for devices of ITO/PEDOT:PSS/Polymer/LiF/Ca/Ag.

The current density as a function of electric intensity of ITO/PEDOT:PSS/Polymer/LiF/Ca/Ag PLEDs comprising polymers 1 to 5 is depicted in FIG. 6. The current density of a PLED comprising polymer 5 began increasing at an electric intensity of approximately $25\times10^6$ $Vm^{-1}$. The remaining polymers all had roughly similar profiles with the polymers ranked according to their current density at an electric intensity greater than about $40\times10^6$ $Vm^{-1}$: polymer 1>polymer 4>polymer 3>polymer 2. At $60\times10^6$ $Vm^{-1}$, the polymers had the following current densities: 135 $mAcm^{-2}$ (polymer 5); 35 $mAcm^{-2}$ (polymer 1); 26 $mAcm^{-2}$ (polymer 4); 20 $mAcm^{-2}$ (polymer 3); and 14 $mAcm^{-2}$ (polymer 2).

Figure 7:
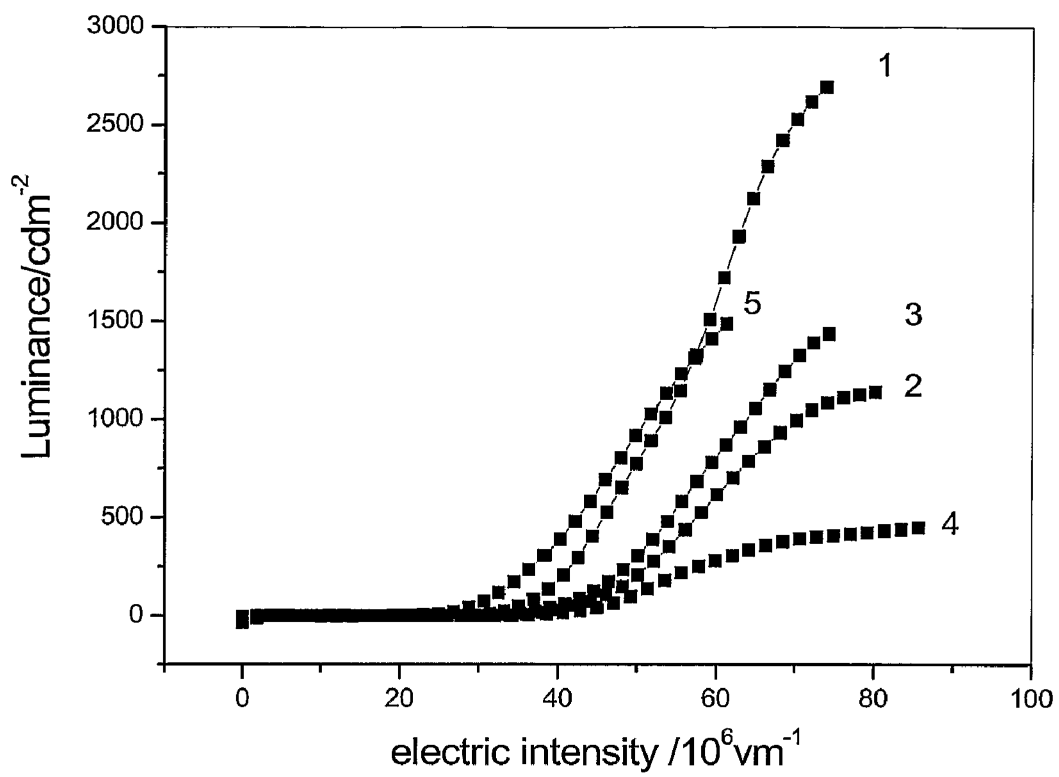
FIG. 7 shows V-L plots for devices of ITO/PEDOT:PSS/Polymer/LiF/Ca/Ag.
Figure 8:
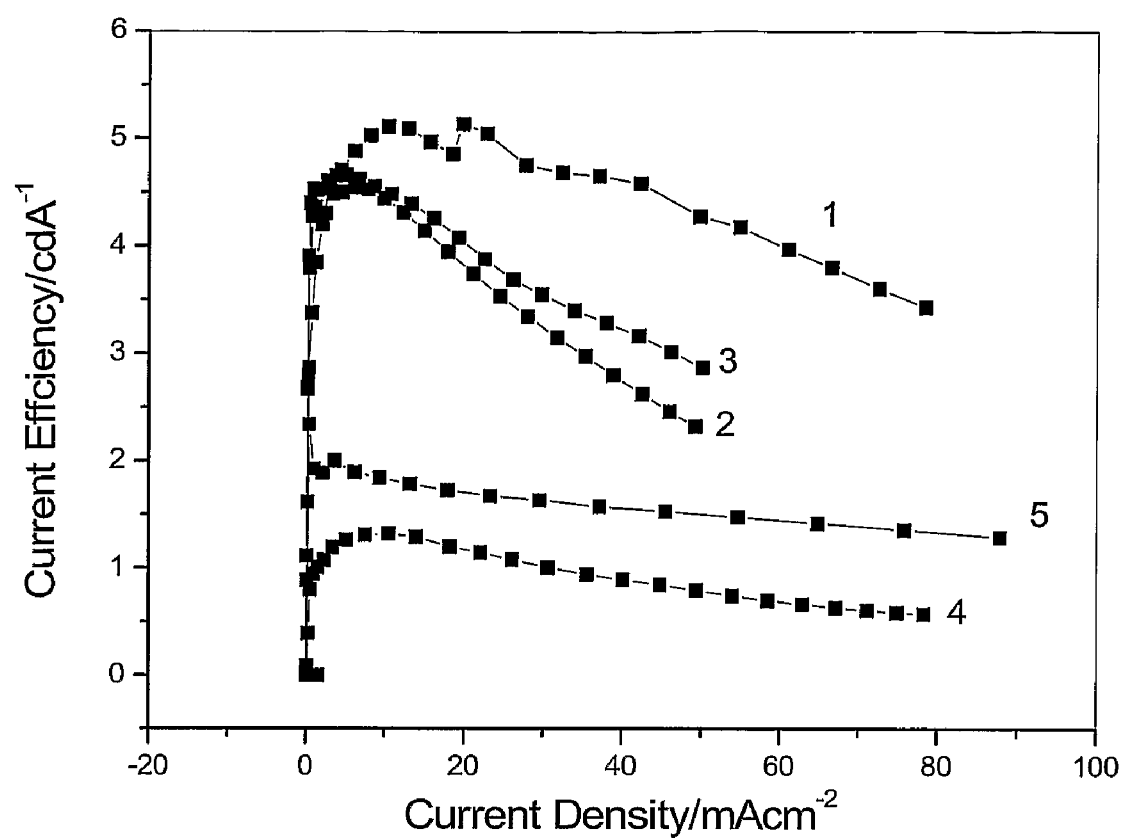
FIG. 8 shows current efficiency vs. current density plots for devices of ITO/PEDOT:PSS/Polymer/LiF/Ca/Ag.

The highest brightness of the devices made with these polymers is 2694 $cd/m^2$ (FIG. 6) and the maximum current efficiency for the different light emitting polymer devices ranged from 1.3 cd/A to 5.1 cd/A. (FIG. 7). The copolymer also demonstrated intense bluish-green emission in the same device configuration. The highest brightness of the copolymer device is 1490 $cd/m^2$ (FIG. 7) and the maximum current efficiency is 2.3 cd/A (FIG. 8). The turn on electric fields of the devices are about 30 MV/m.

The electroluminescent devices described herein may be useful in a number of applications, including displays, liquid crystal display backlights and other lighting applications.

All documents referred to herein are fully incorporated by reference.

Although various embodiments of the invention are disclosed herein, many adaptations and modifications may be made within the scope of the invention in accordance with the common general knowledge of those skilled in this art. Such modifications include the substitution of known equivalents for any aspect of the invention in order to achieve the same result in substantially the same way. All technical and scientific terms used herein have the same meaning as commonly understood by one of ordinary skill in the art of this invention, unless defined otherwise.

The word "comprising" is used as an open-ended term, substantially equivalent to the phrase "including, but not limited to". The following examples are illustrative of various aspects of the invention, and do not limit the broad aspects of the invention as disclosed herein.

EXAMPLES

Example 1

Preparation of 1,2-bis(3'-methylbutoxy)benzene

A solution of catechol (27.53 g, 0.25 mol) in 100 ml of ethanol was slowly added to a stirred solution of KOH (35.07 g, 0.63 mol) in 350 ml of ethanol at room temperature. The reaction mixture was stirred for 1 h. A solution of 3-methylbutyl bromide (113.25 g, 0.75 mol) in 50 ml of ethanol was added dropwise. The reaction mixture was refluxed overnight. Ethanol was removed by rotary evaporation and the reaction mixture was partitioned between ethyl acetate and sodium carbonate solution. After drying over sodium sulfate, the product was obtained by reduced pressure distillation to get 38.2 g 1,2-bis(3'-methylbutoxy)benzene (61%). NMR (ppm) (400 MHz, $CDCl_3$): δ 6.914 (s, 4H), 4.059-4.025 (t, 4H), 1.895-1.861 (m, 2H), 1.757-1.707 (m, 4H), 0.993-0.976 (m, 12H).

Example 2

Preparation of 4,5-bis(3'-methylbutoxy)-1,2-dibromobenzene

A solution of bromine (15.3 g, 96 mmol) in 100 ml of glacial acetic acid was added to a solution of 1,2-bis(3'-methylbutoxy)benzene (10.00 g, 40 mmol) in 300 ml of a mixture of methanol and chloroform at 0° C. The reaction mixture was stirred for 5 h, after which it was basified by addition to sodium carbonate (10%, 2 L) and extracted with dichloromethane (3×500 ml). The combined organic layers were washed with water (200 ml×2) and dried over anhydrous sodium sulfate. Then the solvent was removed on a rotary evaporator, the residue was purified by silica gel flash column eluted with the mixture of hexane and $CH_2Cl_2$ (8:1) to offer 15.67 g 4,5-bis(3'-methylbutoxy)-1,2-dibromobenzene (yield 96%). NMR (ppm) (400 MHz, $CDCl_3$): δ 7.086 (s, 2H), 4.006-3.973 (t, 4H), 1.864-1.831 (m, 2H), 1.741-1.691 (m, 41, 0.998-0.971 (m, 12H).

Example 3

Preparation of 2-(4',5'-bis(3"-methylbutoxy)-2'-bromo)phenyl-p-xylene

In an argon flushed two neck round-bottom flask, a mixture of p-xylene boronic acid (4.8 g, 30 mmol), 12.24 g (30 mmol) of 4,5-bis(3"-methylbutoxy)-1,2-dibromobenzene, 0.15 g tetrakis(triphenylphosphine) palladium, 100 ml of 2M sodium carbonate and 200 ml of toluene were stirred at 80° C. overnight. After cooling down, it was extracted with ethyl acetate and washed with brine and dried over magnesium sulfate. The solvent was removed on a rotary evaporator, the residue was purified by silica gel column eluted with hexane and $CH_2Cl_2$ (8:1) to offer 11.04 g of 2-(4',5'-bis(3"-methylbutoxy)-2'-bromo)phenyl-p-xylene (yield 85%). NMR (ppm) (400 MHz, $CDCl_3$): δ 7.186-7.131 (m, 3H), 6.979 (s, 1H), 6.747 (s, 1H) 4.081-3.966 (m, 4H), 2.372 (s, 3H), 2.111 (s, 3H), 1.914-1.710 (m, 6H), 1.023-0.962 (m, 12H).

Example 4

Preparation of 2-(4',5'-bis(3"-methylbutoxy)-2"-bromo)phenyl-α,α'-diacetoxy-p-xylene 2-(4',5'-bis(3"-methylbutoxy)-2'-bromo)phenyl-p-xylene (0.86 g, 2 mmol), N-bromosuccinimide (0.72 g, 4 mmol) and azo-isobutyronitrile (AIBN) (20 mg) in benzene (5 ml) was heated at reflux for 2 h. After cooling down, the solvent was removed and the mixture was partitioned between ethyl acetate and water. The organic layer was dried over $Na_2SO_4$ and the solvent was removed to give a brown oil containing a mixture of brominated products. A mixture of the crude residue and anhydrous potassium acetate (4 g) in glacial acetic acid (8 ml) was heated at reflux overnight. After cooling, the mixture was partitioned between dichloromethane and water. The organic layer was dried over $Na_2SO_4$ and the solvent was removed to give a brown oil (1.11 g) containing a mixture of acetylated products. The crude product was purified by silica gel column eluted with hexane and $CH_2Cl_2$ (6:1) to offer 0.46 g of 2-(4',5'-bis(3"-methylbutoxy)-2'-bromo)phenyl-α,α'-diacetoxy-p-xylene (yield 42%). NMR ppm) (400 MHz, $CDCl_3$): δ 7.508 (d, J=8.0, 1H), 7.419 (d, J=8.0, 1H), 7.215 (s, 1H), 7.118 (s, 1H), 6.786 (s, 1H), 5.161 (s, 2H), 5.032 (d, J=12.6, 1H), 4.884 (d, J=12.6, 1H), 4.079 (t, 2H), 3.996-3.955 (m, 2H), 2.135 (s, 3H), 2.042 (s, 2H), 1.911-1.611 (m, 6H), 1.285-0.904 (m, 12H).

Example 5

Preparation of 2-(4',5'-bis(3"-methylbutoxy)-2'-p-methoxyphenyl)phenyl-α,α'-diacetoxy-p-xylene In an argon flushed two neck round-bottom flask, a mixture of 4 mmol of p-methoxyphenyl boronic acid, 1.1 g (2 mmol) of 2-(4',5'-bis(3"-methylbutoxy)-2'-bromo)phenyl-α,α'-diacetoxy-p-xylene, 50 mg tetrakis(triphenylphosphine), 10 ml 2M sodium carbonate and 150 ml of toluene were stirred at 90° C. overnight. After cooling down, it was extracted with ethyl acetate and washed with brine and dried with magnesium sulfate. Then the solvent was removed on a rotary evaporator, the residue was purified by silica gel column eluted with hexane and $CH_2Cl_2$ (1:1) to offer a colorless oil (1.10 g, yield 95%). NMR (ppm) (400 MHz, $CDCl_3$): δ 7.296-7.262 (m, 4H), 7.163 (s, 1H), 7.007 (d, J=8.0, 2H), 6.942 (s, 1H), 6.831 (s, 1H), 6.721 (d, J=8.0, 2H), 5.072 (m, 2H), 4.792 (d, 11H), 4.715 (d, 1H), 4.122-4.038 (m, 4H), 3.761 (s, 3H), 2.088 (s, 3H), 2.068 (s, 3H), 1.782-1.742 (m, 6H), 1.014-0.980 (m, 12H).

Example 6

Preparation of 2-(4',5'-bis(3"-methylbutoxy)-2'-p-trifluoromethylphenyl)phenyl-α,α'-diacetoxy-p-xylene In an argon flushed two neck round-bottom flask, a mixture of 4 mmol of p-trifluoromethylphenyl boronic acid, 1.1 g (2 mmol) of 2-(4',5'-bis(3"-methylbutoxy)-2'-bromo)phenyl-α,α'-diacetoxy-p-xylene, 50 mg tetrakis(triphenylphosphine) palladium, 10 ml 2M sodium carbonate and 150 ml of toluene were stirred at 90° C. overnight. After cooling down, it was extracted with ethyl acetate and washed with brine and dried with magnesium sulfate. Then the solvent was removed on a rotary evaporator, the residue was purified by silica gel column eluted with hexane and $CH_2Cl_2$ (2:3) to offer a colorless oil (1.11 g, yield 90%). NMR (ppm) (400 MHz, $CDCl_3$): δ 7.439 (d, J=8.0, 2H), 7.330 (d, 1H), 7.284 (s, 1H), 7.219 (d, J=8.0, 2H), 7.110 (s, 1H), 6.954 (s, 1H), 6.82 (s, 2H), 5.039 (m, 2H), 4.830 (d, 1H), 4.779 (d, 1H), 4.130-4.062 (m, 4H), 2.061 (s, 3H), 1.968 (s, 3H), 1.900-1.753 (m, 6H), 1.020-0.986 (t, 12H).

Example 7

Preparation of 2-(4',5'-bis(3"-methylbutoxy)-2'-p-fluorophenyl)phenyl-α,α'-diacetoxy-p-xylene In an argon flushed two neck round-bottom flask, a mixture of 4 mmol of p-fluorphenyl boronic acid, 1.1 g (2 mmol) of 2-(4',5'-bis(3"-methylbutoxy)-2'-bromo)phenyl-α,α'-diacetoxy-p-xylene, 50 mg tetrakis(triphenylphosphine) palladium, 10 ml 2M sodium carbonate and 150 ml of toluene were stirred at 90° C. overnight. After cooling down, it was extracted with ethyl acetate and washed with brine and dried with magnesium sulfate. Then the solvent was removed on a rotary evaporator, the residue was purified by silica gel column eluted with hexane and $CH_2Cl_2$ (2:3) to offer a colorless oil (1.01 g, yield 90%). NMR (ppm) (400 MHz, $CDCl_3$): δ 7.329-7.271 (m, 2H), 7.118 (s, 1H), 7.059-7.024 (m, 2H), 6.931 (s, 1H), 6.882-6.838 (m, 1H), 5.054 (m, 2H), 4.802 (d, 1H), 4.751 (d, 1H), 4.125-4.039 (m, 4H), 2.083 (s, 3H), 1.980 (s, 3H), 1.891-1.745 (m, 6H), 1.018-0.981 (m, 12H).

Example 8

Preparation of 2-(4',5'-bis(3"-methylbutoxy)-2'-phenyl)phenyl-α,α'-diacetoxy-p-xylene In an argon flushed two neck round-bottom flask, a mixture of 4 mmol of phenyl boronic acid, 1.1 g (2 mmol) of 2-(4',5'-bis(3"-methylbutoxy)-2'-bromo)phenyl-α,α'-diacetoxy-p-xylene, 50 mg tetrakis(triphenylphosphine), 10 ml 2M sodium carbonate and 150 ml of toluene were stirred at 90° C. overnight. After cooling down, it was extracted with ethyl acetate and washed with brine and dried with magnesium sulfate. Then the solvent was removed on a rotary evaporator, the residue was purified by silica gel column eluted with hexane and $CH_2Cl_2$ (1:1) to offer a colorless oil (1.00 g, yield 90%). NMR (ppm) (400 MHz, $CDCl_3$): δ 7.284-7.252 (m, 2H), 7.153 (s, 4H), 7.088 (s, 2H), 6.974 (s, 1H), 6.850 (s, 1H), 5.054 (m, 2H), 4.802 (d, 1H), 4.734 (d, 1H), 4.110-4.060 (m, 4H), 2.080 (s, 3H), 1.972 (s, 3H), 1.886-1.767 (m, 6H), 0.998 (m, 12H).

Example 9

Preparation of 2-(4',5'-bis(3"-methylbutoxy)-2'-p-methoxyphenyl)phenyl-α,α'-dihydroxy-p-xylene A solution of 2.0 mmol of 2-(4',5'-bis(3"-methylbutoxy)-2'-p-methoxy-phenyl)phenyl-α,α'-diacetoxy-p-xylene in 10 ml THF was dropwise added to a 100 ml round bottom flask with 0.2 g of lithium aluminum hydride and 60 ml of THF and stirred for one hour, then the reaction was quenched by added saturated sodium sulfate solution slowly until a white solid come out. The solid was filtered off and the filtrate was washed with water and brine, dried with sodium sulfate. After the solvent was removed, 0.98 g of white solid product was obtained (yield 100%), which was used for next step synthesis without further purification.

Example 10

Preparation of 2-(4',5'-bis(3"-methylbutoxy)-2'-p-trifluoromethylphenyl)phenyl-α,α'-dihydroxy-p-xylene A solution of 2.0 mmol of 2-(4',5'-bis(3"-methylbutoxy)-2'-p-trifluoromethylphenyl)phenyl-α,α'-diacetoxy-p-xylene in 10 ml THF was dropwise added to a 100 ml round bottom flask with 0.2 g of lithium aluminum hydride and 60 ml of THF and stirred for one hour, then the reaction was quenched by the addition of saturated sodium sulfate solution slowly until a white solid come out. The solid was filtered off and the filtrate was washed with water and brine, dried with sodium sulfate. After the solvent was removed, 0.98 g of white solid product was obtained (yield 92%), which was used for next step synthesis without further purification. This was obtained as colorless solid.

Example 11

Preparation of 2-(4',5'-bis(3"-methylbutoxy)-2'-p-fluorophenyl)phenyl-α,α'-dihydroxy-p-xylene A solution of 2.0 mmol of 2-(4',5'-bis(3"-methylbutoxy)-2'-p-fluoro-phenyl)phenyl-α,α'-diacetoxy-p-xylene in 10 ml THF was dropwise added to a 100 ml round bottom flask with 0.2 g of lithium aluminum hydride and 60 ml of THF and stirred for one hour, then the reaction was quenched by the addition of saturated sodium sulfate solution slowly until a white solid come out. The solid was filtered off and the filtrate was washed with water and brine, dried with sodium sulfate. After the solvent was removed, 0.94 g of white solid product was obtained (yield 98%), which was used for next step synthesis without further purification. This was obtained as colorless solid.

Example 12

Preparation of 2-(4',5'-bis(3"-methylbutoxy)-2'-phenyl)phenyl-α,α'-dihydroxy-p-xylene A solution of 2.0 mmol of -(4',5'-bis(3"-methylbutoxy)-2'-phenyl)phenyl-α,α'-diacetoxy-p-xylene in 10 ml THF was dropwise added to a 100 ml round bottom flask with 0.2 g of lithium aluminum hydride and 60 ml of THF and stirred for one hour, then the reaction was quenched by added saturated sodium sulfate solution slowly until a white solid come out. The solid was filtered off and the filtrate was washed with water and brine, dried with sodium sulfate. After the solvent was removed, 0.92 g of white solid product was obtained (yield 100%), which was used for next step synthesis without further purification. This was obtained as colorless solid.

Example 13

Preparation of 2-(4',5'-bis(3"-methylbutoxy)-2'-p-methoxy-phenyl)phenyl-α,α'-dichloro-p-xylene In a 10 ml round bottom flask, 2.0 mmol of 2-(4',5'-bis(3"-methylbutoxy)-2'-p-methoxy-phenyl)phenyl-α, α'dihydroxy-p-xylene and 5 ml of thionyl chloride was stirred at 50° C. for 3 hours. On completion of reaction, the mixture was poured into ice water and partitioned between ethyl acetate and water. The organic layer was dried over $Na_2SO_4$ and the solvent was removed to give a brown oil. The residue was purified by column chromatography using hexane:methylene choloride (5:1) as the eluent to yield 0.49 g of colourless solid (46%). NMR ppm) (400 MHz, $CDCl_3$): δ 7.423 (d, 1H), 7.301 (d, 1H), 7.161 (s, 1H), 6.980 (s, 1H), 6.958 (s, 2H), 6.918 (s, 1H), 6.721 (d, 2H), 4.526 (m, 2H), 4.363 (d, 1H), 4.219 (d, 1H) 4.113-4.070 (m, 4H), 3.746 (s, 3H), 1.906-1.752 (m, 6H), 1.018-0.981 (t, 12H).

Example 14

Preparation of 2-(4',5'-bis(3"-methylbutoxy)-2'-p-trifluoromethyl-phenyl)phenyl-α,α'-dichloro-p-xylene In a 10 ml round bottom flask, 2.0 mmol of 2-(4',5'-bis(3"-methylbutoxy)-2'-p-trifluoromethyl-phenyl)phenyl-α,α'-dihydroxy-p-xylene and 5 ml of thionyl chloride was stirred at 50° C. for 3 hours. On completion of the reaction, the mixture was poured into ice water and partitioned between ethyl acetate and water. The organic layer was dried over $Na_2SO_4$ and the solvent was removed to give a brown oil. The residue was purified by silica gel column chromatography using hexane:methylene choloride (5:1) as the eluent to yield 0.48 g of colourless solid (42%). NMR (ppm) (400 MHz, $CDCl_3$): δ 7.446-7.421 (m, 3H), 7.319-7.296 (m, 1H), 7.189 (d, 2H), 7.084 (s, 1H), 6.973 (d, 2H), 4.501-4.424 (m, 2H), 4.395-4.305 (m, 2H), 4.142-4.087 (m, 4H), 1.929-1.747 (m, 6H), 1.024-0.987 (t, 12H).

Example 15

Preparation of 2-(4',5'-bis(3"-methylbutoxy)-2'-p-fluoro-phenyl)phenyl-α,α'-dichloro-p-xylene In a 10 ml round, bottom flask, 2.0 mmol of 2-(4',5'-bis(3"-methylbutoxy)-2'-p-fluoro-phenyl)phenyl-α,α'-dihydroxy-p-xylene and 5 ml of thionyl chloride was stirred at 50° C. for 3 hours. On completion of the reaction, the mixture was poured into ice water and partitioned between ethyl acetate and water. The organic layer was dried over $Na_2SO_4$ and the solvent was removed to give a brown oil. The residue was purified by silica gel column chromatography using hexane: methylene choloride (5:1) as the eluent to yield 0.62 g of colourless solid (60%). NMR (ppm) (400 MHz, $CDCl_3$): δ 7.432 (d, 1H), 7.309 (d, 1H), 7.116 (s, 1H), 7.036-7.001 (t, 2H) 6.949-6.933 (d, 2H), 6.884-6.841 (t, 2H), 4.535 (m, 2H), 4.371 (d, 1H), 4.282 (d, 1H) 4.138-4.076 (m, 4H), 1.930-1.756 (m, 6H), 1.024-0.985 (t, 12H).

Example 16

Preparation of 2-(4',5'-bis(3"-methylbutoxy)-2'-phenyl)phenyl-α,α'-dichloro-p-xylene In a 10 ml round bottom flask, 2.0 mmol of 2-(4',5'-bis(3"-methylbutoxy)-2'-phenyl)phenyl-α,α'-dihydroxy-p-xylene and 5 ml of thionyl chloride was stirred at 50° C. for 3 hours. On completion of the reaction, the mixture was poured into ice water and partitioned between ethyl acetate and water. The organic layer was dried over $Na_2SO_4$ and the solvent was removed to give a brown oil. The residue was purified by silica gel column chromatography using hexane:methylene chloride (5:1) as the eluent to yield 0.60 g of colourless solid (60%). NMR (ppm) (400 MHz, $CDCl_3$): δ 7.417 (d, 1H), 7.303 (d, 1H), 7.174-7.145 (m, 4H), 7.067-7.048 (t, 2H) 6.994

(s, 1H), 6.947 (s, 1H), 4.501 (m, 2H), 4.386 (d, 1H), 4.357 (d, 1H) 4.142-4.084 (m, 4H), 1.912-1.743 (m, 6H), 1.023-0.988 (t, 12H).

Example 17

Preparation of 2,7-diacetoxymethyl-9,9-dihexyl-fluorene 3.32 g (10 mmol) of 9,9-dihexyl-fluorene and 0.9 g of paraformaldehyde was refluxed with 30 ml of HBr in acetic acid (48%) for 2 hours, then the solution was cooled down to room temperature and poured into 300 ml of water. After neutralization with sodium carbonate, the solution was extracted with hexane and the organic phase was washed with water and brine. The organic phase was dried over sodium sulfate and the solvent was removed on a rotary evaporator. The crude product was mixed with 8 g of anhydrous potassium acetate and 10 ml of glacial acetic acid and heated at reflux overnight. After cooling, the mixture was partitioned between dichloromethane and water. The organic layer was dried over $Na_2SO_4$ and the solvent was removed to give a colorless oil. 3.02 g of pure 2,7-diacetoxymethyl-9,9-dihexyl-fluorene (yield 63%) was obtained after silica gel column purification eluted with hexane: $CH_2CH_2$ (6:1).

Example 18

Preparation of 2,7-dichloromethyl-9,9-dihexyl-fluorene

A solution of 2.0 g of 2,7-diacetoxymethyl-9,9-dihexyl-fluorene (4.22 mmol) in 20 ml of THF was added into a 150 ml round bottom flask with 0.5 g of lithium aluminum hydride and 80 ml of THF. The mixture was stirred for one hour, then quenched by saturated sodium sulfate solution slowly until a white solid come out. The solid was filtered off and the filtrate was washed with water and brine, dried with sodium sulfate. After removal of the solvent, the white solid residue was stirred with 10 ml of thionyl chloride at room temperature for 2 hours. On completion of the reaction, the mixture poured into ice water and partitioned between ethyl acetate and water. The organic layer was dried over $Na_2SO_4$ and the solvent was removed to give a brown oil. The residue was chromatographed on silica gel using hexane:methylene chloride (5:1) as the eluent to yield 1.46 g of colourless pure 2,7-dichloromethyl-9,9-dihexyl-fluorene (yield 81%).

Example 19

Preparation of poly[2-(2'-p-methoxyphenyl-4',5'-bis (3"-methylbutoxy))phenyl-1,4-phenylene vinylene] (Polymer 1)

To a solution of 2-(4',5'-bis(3"-methylbutoxy)-2'-p-methoxyphenyl)phenyl-α,α'-dichloro-p-xylene (0.8 mmol) in 15 ml of anhydrous THF was added a solution of 0.48 ml 1 M of potassium tert-butoxide in 8 ml of anhydrous THF at room temperature with stirring for 24 h, after which 0.1 g of 4-(tert-butyl)benzyl chloride in 2 ml of THF was added in one portion. After stirring for another 6 hours, the mixture was added into methanol and the resulting yellow precipitate was collected by filtration. The polymer was dissolved in toluene and reprecipitated from a mixture solvent of methanol and water (V:V=7:1) for 3 times. The collected polymer was extracted through a Soxhlet extractor using methanol followed by acetone. 0.182 g of bright yellow polymer was obtained with a yield of 50%. NMR (ppm) (400 MHz, $CDCl_3$): δ 7.50-6.662 (11H), 4.114-4.075 (4H), 3.719 (3H), 1.895-1.770 (6H), 1.017-0.966 (12H).

Example 20

Preparation of poly[2-(2'-p-trifluoromethyl-phenyl-4',5'-bis(3"-methylbutoxy))phenyl-1,4-phenylene vinylene] (Polymer 2)

To a solution of 2-(4',5'-bis(3"-methylbutoxy)-2'-p-trifluoromethylphenyl)phenyl-α,α'-dichloro-p-xylene (0.8 mmol) in 15 ml of anhydrous THF was added a solution of 0.48 ml 1 M of potassium tert-butoxide in 8 ml of anhydrous THF at room temperature with stirring for 24 h, after which 0.1 g of 4-(tert-butyl)benzyl chloride in 2 ml of THF was added in one portion. After stirring for another 6 hours, the mixture was added into methanol and the resulting yellow precipitate was collected by filtration. The polymer was dissolved in toluene and reprecipitated from a mixture solvent of methanol and water (V:V=7:1) 3 times. The collected polymer was extracted through a Soxhlet extractor using methanol followed by acetone. 0.160 g of bright yellow polymer was obtained with a yield of 41%. NMR (ppm) (400 MHz, $CDCl_3$): δ 7.383-6.950 (11H), 4.118 (4H), 1.899-1.791 (6H), 1.022-0.981 (12H).

Example 21

Preparation of poly[2-(2'-p-fluorophenyl-4',5'-bis(3"-methylbutoxy))phenyl-1,4-phenylene vinylene] (Polymer 3)

To a solution of 2-(4',5'-bis(3"-methylbutoxy)-2'-p-fluorophenyl)phenyl-α,α'-dichloro-p-xylene (0.8 mmol) in 15 ml of anhydrous THF was added a solution of 0.48 ml 1 M of potassium tert-butoxide in 8 ml of anhydrous THF at room temperature with stirring for 24 h, after which 0.1 g of 4-(tert-butyl)benzyl chloride in 2 ml of THF was added in one portion. After stirring for another 6 hours, the mixture was added into methanol and the resulting yellow precipitate was collected by filtration. The polymer was dissolved in toluene and reprecipitated from a mixture solvent of methanol and water (7:1) 3 times. The collected polymer was extracted through a Soxhlet extractor using methanol followed by acetone. 0.180 g of bright yellow polymer was obtained with a yield of 51%. NMR (ppm) (400 MHz, $CDCl_3$): δ 7.500-6.964 (11H), 4.135 (4H), 1.890-1.791 (6H), 1.021-0.975 (12H).

Example 22

Preparation of poly[2-(2'-phenyl-4',5'-bis(2"-methylbutoxy))phenyl-1,4-phenylene vinylene] (Polymer 4)

To a solution of 2-(4',5'-bis(3"-methylbutoxy)-2'-phenyl) phenyl-α,α'-dichloro-p-xylene (0.8 mmol) in 15 ml of anhydrous THF was added a solution of 0.48 ml 1 M of potassium tert-butoxide in 8 ml of anhydrous THF at room temperature with stirring for 24 h, after which 0.1 g of 4-(tert-butyl)benzyl chloride in 2 ml of THF was added in one portion. After stirring for another 6 hours, the mixture was added into methanol and the resulting yellow precipitate was collected by filtration. The polymer was dissolved in toluene and reprecipitated from a mixture solvent of methanol and water (V:V=7:1) 3 times. The collected polymer was extracted through a Soxhlet extractor using methanol followed by acetone. 0.188 g of bright yellow polymer was obtained with a yield of 55%. NMR (ppm) (400 MHz, $CDCl_3$): δ 7.500-6.80 (12H), 4.180 (4H), 1.890-1,791 (6H), 1.018-0.975 (12H).

Example 23

Preparation of poly[2-(2'-phenyl-4',5'-bis(3"-methylbutoxy))phenyl-1,4-phenylene vinylene-co-9,9-dihexyl-2,7-fluorenylene vinylene]. (Polymer 5)

To a solution of 2-(4',5'-bis(3"-methylbutoxy)-2'-phenyl) phenyl-α,α'-dichloro-p-xylene (0.40 g, 0.8 mmol) and 0.085 g of 2,7-dichloromethyl-9,9-dihexylfluorene (0.2 mmol) in 20 ml of anhydrous THF was added a solution of 6.0 ml of 1 M potassium tert-butoxide in 10 ml of anhydrous THF at room temperature with stirring for 24 h, after which 0.1 g of 4-(tert-butyl)benzyl chloride in 2 ml THF was added in one portion. After stirring for another 6 hours, the reaction mixture was precipitated in methanol. The resulting yellow precipitate was collected by filtration and dissolved in toluene and reprecipitated from a mixture solvent of methanol and water (V:V=7:1) 3 times. The collected polymer was extracted through a Soxhlet extractor using methanol followed by acetone. 0.22 g of bright yellow polymer was obtained with a yield of 53%. NMR (ppm) (400 MHz, $CDCl_3$) 7.530-6.60 (13H), 4.150 (4H), 1.925-1.787 (7H) 1.278-0.972 (18H).

Example 24

Preparation of Electroluminescent Device from Polymer 1

Figure 9:
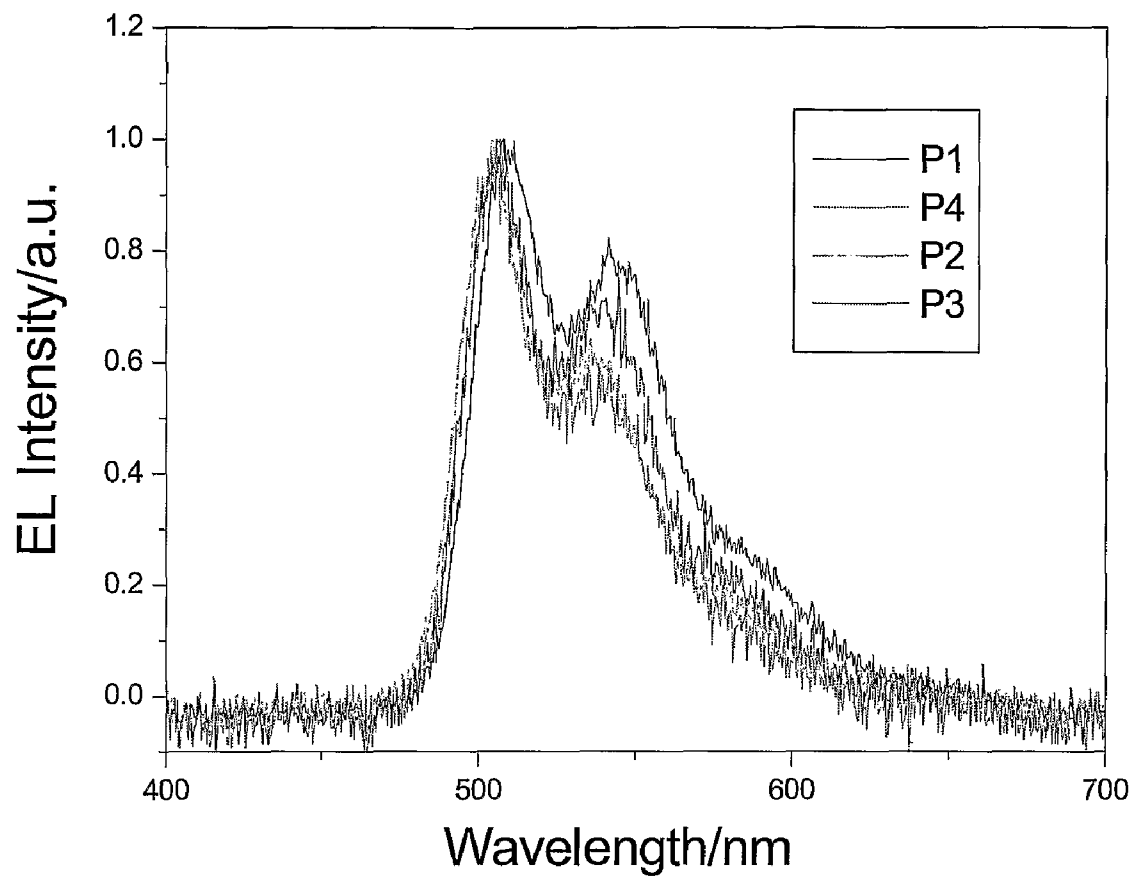
FIG. 9 shows electroluminescent spectra for the ITO/PEDOT:PSS/Polymer/LiF/Ca/Ag devices of Example 24 containing Polymer 1 (P1), Polymer 2 (P2), Polymer 3 (P3) and Polymer 4 (P4).

A first layer of poly(3,4-ethylenedioxythiophene) doped with poly(styrenesulfonic acid) (PEDOT:PSS) was spin-coated on a glass support with a patterned ITO coating to form a hole injection layer with a thickness of about 50 nm. After dried in an oven at 80° C. for 12 hour, polymer 1 dissolved in toluene (5 mg/ml) was spin-coated on the first layer to form a light emitting layer with a thickness of about 80 nm. On the polymer layer, 0.5 nm of LiF, 20 nm of Ca and 150 nm of Ag were vacuum deposited respectively. The organic electroluminescent device obtained was examined for it's EL spectrum, current-voltage-brightness and luminous efficiency. Polymer 1 emits green light with the maximum emission wavelength of 508 nm and a side peak of 542 nm (FIG. 9). The turn-on electric field was found to be 28 MV/m. The maximum brightness and current efficiency were 2694 cd/$m^2$ and 5.1 cd/A.

Example 25

Preparation of Electroluminescent Device from Polymer 2

A first layer of poly(3,4-ethylenedioxythiophene) doped with poly(styrenesulfonic acid) (PEDOT:PSS) was spin-coated on a glass support with a patterned ITO coating to form a hole injection layer with a thickness of about 50 nm. After dried in an oven at 80° C. for 12 hour, polymer 2 dissolved in toluene (5 mg/ml) was spin-coated on the first layer to form a light emitting layer with a thickness of about 80 nm. On the polymer layer, 0.5 nm of LiF, 20 nm of Ca and 150 μm of Ag were vacuum deposited respectively. The organic electroluminescent device obtained was examined for it's EL spectrum, current-voltage-brightness and luminous efficiency. Polymer 2 emits green light with the maximum emission wavelength of 505 nm and a side peak of 539 nm. The turn-on electric field was found to be 34 MV/m. The maximum brightness and current efficiency were 1144 cd/$m^2$ and 4.6 cd/A.

Example 26

Preparation of Electroluminescent Device from Polymer 3

A first layer of poly(3,4-ethylenedioxythiophene) doped with poly(styrenesulfonic acid) (PEDOT:PSS) was spin-coated on a glass support with a patterned ITO coating to form a hole injection layer with a thickness of about 50-nm. After dried in an oven at 80° C. for 12 hour, polymer 3 dissolved in toluene (5 mg/ml) was spin-coated on the first layer to form a light emitting layer with a thickness of about 80 nm. On the polymer layer, 0.5 nm of LiF, 20 nm of Ca and 150 nm of Ag were vacuum deposited respectively. The organic electroluminescent device obtained was examined for it's EL spectrum, current-voltage-brightness and luminous efficiency. Polymer 3 emits green light with the maximum emission wavelength of 507 nm and a side peak of 540 nm. The turn-on electric field was found to be 32 MV/m. The maximum brightness and current efficiency were 1437 cd/$m^2$ and 4.7 cd/A.

Example 27

Preparation of Electroluminescent Device from Polymer 4

A first layer of poly(3,4-ethylenedioxythiophene) doped with poly(styrenesulfonic acid) (PEDOT:PSS) was spin-coated on a glass support with a patterned ITO coating to form a hole injection layer with a thickness of about 50 nm. After dried in an oven at 80° C. for 12 hour, polymer 4 dissolved in toluene was spin-coated on the first layer to form a light emitting layer with a thickness of about 80 nm. On the polymer layer, 0.5 nm of LiF, 20 nm of Ca and 150 nm of Ag were vacuum deposited respectively. The organic electroluminescent device obtained was examined for it's EL spectrum, current-voltage-brightness and luminous efficiency. Polymer 4 emits green light with the maximum emission wavelength of 503 nm and a'side peak of 540 nm. The turn-on electric field was found to be 34 MV/m. The maximum brightness and current efficiency were 450 cd/$m^2$ and 1.3 cd/A.

Example 28

Preparation of Electroluminescent Device from Polymer 5

A first layer of poly(3,4-ethylenedioxythiophene) doped with poly(styrenesulfonic acid) (PEDOT:PSS) was spin-coated on a glass support with a patterned ITO coating to form a hole injection layer with a thickness of about 50 nm. After dried in an oven at 80° C. for 12 hour, polymer 5 dissolved in toluene was spin-coated on the first layer to form a light emitting layer with a thickness of about 80 nm. On the polymer layer, 0.5 nm of LiF, 20 nm of Ca and 150 nm of Ag were vacuum deposited respectively. The organic electroluminescent device obtained was examined for it's EL spectrum, current-voltage-brightness and luminous efficiency. The turn-on electric field was found to be 20 MV/m. The maximum brightness and current efficiency were 1490 cd/$m^2$ and 2.3 cd/A.

What is claimed is:

1. A conjugated polymer that is poly[2-(2'-p-methoxyphenyl-4',5'-bis(3"-methylbutoxy))phenyl-1,4-phenylene vinylene], poly[2-(2'-p-trifluoromethyl-phenyl-4',5'-bis(3"-methylbutoxy))phenyl-1,4-phenylene vinylene], poly[2-(2'-p-fluorophenyl-4',5'-bis(3"-methylbutoxy))phenyl-1,4-phenylene vinylene] or poly[2-(2'-phenyl-4',5'-bis(3"-methylbutoxy))phenyl-1,4-phenylene vinylene-co-9,9-dihexyl-2,7-fluorenylene vinylene].

2. The conjugated polymer according to claim 1, wherein the polymer is poly[2-(2'-p-methoxyphenyl-4',5'-bis(3"-methylbutoxy))phenyl-1,4-phenylene vinylene].

3. The conjugated polymer according to claim 1, wherein the polymer is poly[2-(2'-p-trifluoromethyl-phenyl-4',5'-bis(3"-methylbutoxy))phenyl-1,4-phenylene vinylene].

4. The conjugated polymer according to claim 1, wherein the polymer is poly[2-(2'-p-fluorophenyl-4',5'-bis(3"-methylbutoxy))phenyl-1,4-phenylene vinylene].

5. The conjugated polymer according to claim 1, wherein the polymer is poly[2-(2'-phenyl-4',5'-bis(3"-methylbutoxy))phenyl-1,4-phenylene vinyl ene-co-9,9-dihexyl-2,7-fluorenylene vinylene].

6. The conjugated polymer according to claim 1 wherein the conjugated polymer luminesces green light.

7. The conjugated polymer according to claim 1 wherein the conjugated polymer is electroluminescent.

8. The conjugated polymer according to claim 1 wherein the conjugated polymer is soluble in an organic solvent at room temperature.

9. The conjugated polymer according to claim 8 wherein the organic solvent is tetrahydrofuran, toluene, xylene, chloroform, mesitylene or mixtures thereof.

10. A process for preparing a conjugated polymer according to claim 1 comprising the step of polymerizing a PPV-monomer derivative by a dehalogenation condensation reaction.

11. The process according to claim 10 wherein the step of polymerizing the PPV-monomer derivative comprises adding a non-nucleophilic base to the PPV-monomer derivative.

12. The process according to claim 11 wherein the non-nucleophilic base is tert-butoxide.

13. The process according to claim 10 wherein the polymerizing is effected in tetrohydrofuran or in a solvent having a polarity equal to or greater than that of tetrohydrofuran.

14. A process for preparing a conjugated polymer according to claim 1 comprising the step of polymerizing a PPV-monomer derivative by a Wittig reaction.

15. A film comprising a conjugated polymer according to claim 1.

16. The film according to claim 15 wherein the film has a thickness of about 30 nm to about 200 nm.

17. An electroluminescent device comprising an emissive layer, the emissive layer comprising a polymer according to claim 1.

18. The electroluminescent device according to claim 17 wherein the emissive layer is a film.

19. The electroluminescent device according to claim 18 wherein the film has a thickness of about 30 nm to about 200 nm.

20. The electroluminescent device according to claim 17 further comprising an anode and a cathode.

21. The electroluminescent device according to claim 20 wherein the cathode is barium, calcium, magnesium, indium, aluminum, ytterbium, a magnesium:silver alloy, or an aluminum:lithium alloy.

22. The electroluminescent device according to claim 17 further comprising a hole injection layer between the emissive layer and the anode.

23. The electroluminescent device according to claim 22 wherein the hole injection layer is PEDOT:PSS, polyaniline, aromatic tertiary amine, polyvinylcarbazole, quinacridone, porphyrin or phthalocyanine.

24. The electroluminescent device according to claim 20 further comprising an electron injection layer between the emissive layer and the cathode.

25. The electroluminescent device according to claim 17 wherein the anode is transparent, semi-transparent or translucent.

26. The electroluminescent device according to claim 25 wherein the transparent, semi-transparent or translucent anode is indiumtinoxide.

27. The electroluminescent device according to claim 24 further comprising an electron tunneling layer between the electron injection layer and the cathode.

28. The electroluminescent device according to claim 27 wherein the electron tunneling layer comprises LiF, parylene or $MgF_2$.

29. The electroluminescent device according to claim 28 wherein the hole injection layer is PEDOT:PSS, the electron tunneling layer is LiF and the cathode is calcium.

30. The electroluminescent device according to claim 17 further comprising an electron transporting layer.

31. The electroluminescent device according to claim 30 wherein the electron transporting layer comprises aluminum tris(8-hydroxyquinoline), 2-(4-biphenyl)-5-(4-tert-butylphenyl)-1,3,4,oxadiazole or 2,2',2"-1,3,5-benzenetriyl)tris-[1-phenyl-1H-benzimidazole].

32. The electroluminescent device according to claim 20 wherein at least one of the cathode and the anode is disposed on a support.

33. The electroluminescent device according to claim 32 wherein the support is transparent, semi-transparent or translucent.

34. The electroluminescent device according to claim 32 wherein the support is flexible.

35. The electroluminescent device according to claim 17 wherein the emissive layer comprising one or more electroluminescent polymers is prepared by solution coating.

36. The electroluminescent device according to claim 35 wherein the solution coating comprises spin coating, casting, microgravure coating, gravure coating, bar coating, roll coating, wire bar coating, dip coating, spray coating, screen printing, flexo printing, offset printing or inkjet printing.

* * * * *

UNITED STATES PATENT AND TRADEMARK OFFICE

CERTIFICATE OF CORRECTION

PATENT NO. : 8,377,570 B2
APPLICATION NO. : 11/666833
DATED : February 19, 2013
INVENTOR(S) : Zhikuan Chen and Chun Huang It is certified that error appears in the above-identified patent and that said Letters Patent is hereby corrected as shown below:

On the Title Page:

Item (54) and in the Specification, Column 1, lines 1-4 (Title of the invention):

"LIGHT EMITTING POLYMER" should read -- LIGHT EMITTING POLYMERS --

In the Claims:

Column 25, Line 22 (Claim 5): "vinyl ene-co-" should read -- vinylene-co- --

Column 25, line 42 (Claim 12): "tert-butoxide" should read -- *tert*-butoxide --

Signed and Sealed this
Third Day of December, 2013

Margaret A. Focarino
*Commissioner for Patents of the United States Patent and Trademark Office*